United States Patent
Yamazaki et al.

(10) Patent No.: US 6,677,621 B2
(45) Date of Patent: Jan. 13, 2004

(54) LIGHT EMITTING DEVICE AND ELECTRICAL APPLIANCE

(75) Inventors: Shunpei Yamazaki, Tokyo (JP); Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/862,680

(22) Filed: May 21, 2001

(65) Prior Publication Data

US 2001/0050373 A1 Dec. 13, 2001

(30) Foreign Application Priority Data

May 22, 2000 (JP) ........................................ 2000-150484

(51) Int. Cl.[7] .............................................. H01L 33/00
(52) U.S. Cl. ......................... 257/103; 257/40; 257/47; 257/291
(58) Field of Search ............................. 257/40, 47, 72, 257/102, 103, 291, 383; 438/22, 29, 502; 315/169.3

(56) References Cited

U.S. PATENT DOCUMENTS

| 4,974,942 | A | * | 12/1990 | Gross et al. | ................. | 349/141 |
| 5,216,331 | A | * | 6/1993 | Hosokawa et al. | ......... | 313/498 |
| 5,294,810 | A | | 3/1994 | Egusa et al. | | |
| 5,756,224 | A | * | 5/1998 | Borner et al. | ................ | 313/503 |
| 6,160,272 | A | * | 12/2000 | Arai et al. | ................... | 257/291 |
| 6,303,238 | B1 | * | 10/2001 | Thompson et al. | ..... | 252/301.16 |
| 6,310,360 | B1 | * | 10/2001 | Forrest et al. | ............... | 257/102 |

FOREIGN PATENT DOCUMENTS

| EP | 0 390 551 B1 | 7/1996 |
| JP | 02-261889 | 10/1990 |
| JP | 03-115486 | 5/1991 |
| JP | 03-230583 | 10/1991 |
| JP | 03-230584 | 10/1991 |
| JP | 10-148853 | 6/1998 |
| JP | 11-338786 | 12/1999 |

OTHER PUBLICATIONS

Tsutsui, et al., "Electroluminescence in Organic Thin Films", Photochemical Processes in Organized Molecular Systems, pp. 437–450, 1991, (No month).
Baldo, et al., "Highly efficient phosphorescent emission from organic electroluminescent devices", Nature, vol. 395, pp. 151–154, Sep. 10, 1998.
Baldo, et al., "Very high–efficiency green organic light–emitting devices based on electrophosphorescence", Applied Physics Letters, vol. 75, No. 1, pp. 4–6, Jul. 5, 1999.
Tsutsui, et al., "High Quantum Efficiency in Organic Light–Emitting Devices with Iridium–Complex as a Triplet Emissive Center", Japanese Journal of Applied Physics, vol. 38, Part 2, No. 12B, pp. L1502–L1504, Dec. 15, 1999.

(List continued on next page.)

*Primary Examiner*—Hoai Ho
*Assistant Examiner*—Dao H. Nguyen
(74) *Attorney, Agent, or Firm*—Fish & Richardson P.C.

(57) ABSTRACT

There is provided a light emitting device which is bright and has low electric power consumption and high reliability. A triplet EL element 203 electrically connected to a current controlling TFT 102 is provided in a pixel portion 201. A luminescent material used for the triplet EL element 203 has a feature that EL is obtained by triplet excitation, and exhibits high luminous efficiency at a low operation voltage as compared with the prior art. Accordingly, the operation is made at the low operation voltage, so that the light emitting device which is bright and has low electric power consumption and high reliability can be obtained.

41 Claims, 19 Drawing Sheets

OTHER PUBLICATIONS

M. A. Baldo et al.; "Highly efficient phosphorescent emission from organic electroluminescent devices"; *Nature, vol. 395*; pp. 151–154; Sep. 10, 1998.

Nishi, T. et al., "High efficiency TFT–OLED display with iridium–complex as triplet emissive center." EL '00 Proceedings, pp. 353–356 (Dec. 2000).

Inukai, K. et al., "36.4L: Late–news paper: 4.0–in. TFT–OLED displays and a novel digital driving method." SID 00 Digest, vol. XXXI, pp. 924–997 (May 2000).

Mizukami, M. et al., "36.1: 6–bit digital VGA OLED." SID 00 Digest, vol. XXXI, pp. 912–915 (May 2000).

* cited by examiner

TIMING CHART OF GATE SIGNALS
WHEN A DATA SIGNAL IS WRITTEN IN A PIXEL

TIMING CHART OF GATE SIGNALS
WHEN A DATA SIGNAL IS ERASED FROM A PIXEL

LIGHT EMITTING DEVICE AND ELECTRICAL APPLIANCE

BACKGROUND OF THE INVENTION

1. Field of the Invention

The present invention relates to a light emitting device including a element (hereinafter referred to as an EL element) in which a thin film (hereinafter referred to as an EL film) made of a luminescent material capable of generating electroluminescence (hereinafter abbreviated as EL) is interposed between a pair of electrodes. Incidentally, in the present specification, an EL element using a luminescent material in which EL is obtained by singlet excitation is called a singlet EL element, and an EL element using a luminescent material in which EL is obtained by triplet excitation is called a triplet EL element.

2. Description of the Related Art

In recent years, an EL element using an organic EL film as a light emitting layer has been developed, and EL elements using various organic EL films have been proposed. An attempt to realize a flat panel display by employing a light emitting device, which uses an EL element of the kind as a light emitting element, has been made.

As a light emitting device using an EL element, a passive matrix type and an active matrix type are known. The passive matrix type is a light emitting device using an EL element made of a structure in which stripe-like anodes and cathodes are provided to intersect with each other at right angles and an EL film is interposed between them. The active matrix type is a system in which a semiconductor component is provided for each of pixels, and one of an anode and a cathode of an EL element is connected to the semiconductor component, so that a current flowing through the EL element is controlled by the semiconductor component.

However, in both the passive matrix type light emitting device and the active matrix type light emitting device, since the light emission performance of the EL element is greatly influenced by the physical properties of the EL film itself, the development of the EL element being bright and having high reliability has been just the development of a luminescent material.

Although various kinds of luminescent materials from a low molecular material to a high molecular material are developed, a theoretical upper limit of luminous efficiency has been always a problem. Especially, with respect to internal quantum efficiency, it has been thought that the ratio of the generation efficiency of singlet exciton to the generation efficiency of triplet exciton is 1:3, and only the singlet exciton contributes to light emission (fluorescent emission).

Thus, even if all carriers (electrons and holes) are recombined, 25% of the whole contributes to the light emission, and if extracting efficiency to the outside of the component is 20%, external quantum efficiency becomes 5% in total. That is, according to the calculation, only 5% of consumed energy can be extracted.

However, recently, a material in which light emission (phosphorescent emission) using triplet exciton is proposed, and its high luminous efficiency attracts attention. As examples which the triplet exciton is used and the external quantum efficiency is improved, there are following reports.

(1) T. Tsutsui, C Adachi, S. Saito, Photochemical Processes in Organized Molecular System, ed. K. Honda, (Elsevier Sci. Pub., Tokyo, 1991) p. 437.

(2) M. A. Baldo, D. F. O'Brien, Y. You, A. Shoustikov, S. Sibley, M. E. Thompson, S. R. Forrest, Nature 395 (1998) p. 151.

(3) M. A. Baldo, S. Lamansky, P. E. Burrows, M. E. Thompson, S. R. Forrest, Appl. Phys. Lett., 75 (1999) p.4.

(4) T. Tsutsui, M. -J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

The luminescent materials set forth in the above papers are examples in which the external quantum efficiency is improved by obtaining phosphorescence from the triplet exciton.

SUMMARY OF THE INVENTION

An object of the present invention is to provide a light emitting device which is bright and has low electric power consumption, by using an EL element having high luminous efficiency.

Another object of the present invention is to provide an electrical appliance which has a bright display portion and low electric power consumption, by using the light emitting device.

Still another object of the present invention is to provide an electrical appliance having low electric power consumption by using the light emitting device of the present invention as a light source (typically, a backlight).

A light emitting device of the present invention is characterized in that a triplet EL element is electrically connected to a semiconductor component and is controlled. That is, the present invention is characterized by using the triplet EL element as a light emitting element in an active matrix type light emitting device. As the semiconductor component, a field effect transistor (FET), preferably a thin film transistor (TFT) can be used.

First, a process up to the present invention will be described. When a voltage is applied between an anode and a cathode of an EL element, a carrier (electron or hole) is injected into an EL film, and luminescence is generated by recombination. Thus, a proportionality relation is obtained between density of current flowing through the EL element and luminous brightness. Incidentally, in the present specification, a voltage applied to an EL element is called an operation voltage of the EL element.

FIG. 3 is a graph schematically showing this relation. FIG. 3 shows the relation between the density of current flowing through an EL element and the luminous brightness. Reference numeral 301 indicates a characteristic of a conventional EL element using singlet excitation (singlet EL element); and 302, a characteristic of an EL element using triplet excitation (triplet EL element) .

The characteristic of the singlet EL element shown as 301 is that although the proportionality relation (linear relation) is obtained when the current density is low, an inclination becomes small as the current density becomes high. That is, it is known that even if the current density increases, the luminous brightness becomes hard to increase over a certain point. This tendency is remarkable in the case of the characteristic of the triplet EL element shown as 302. When the current density is low, it is in the proportionality relation having an inclination larger than the singlet EL element with respect to the luminous brightness. However, when the current density increases, the inclination becomes extremely small, and there occurs such a state where luminous brightness is hardly changed even if the current density increases.

From the graph of FIG. 3, it is understood that although the luminous brightness is several times higher than that of the singlet EL element when the triplet EL element emits light in the operation region of small current density, it becomes almost equal to the luminous brightness of the singlet EL element in the operation region of high current density.

FIG. 4 shows a relation between the operation voltage of an EL element and its luminous efficiency. Reference numeral 401 indicates a characteristic of a singlet EL element; and 402, a characteristic of a triplet EL element. An operation voltage "a" indicates an operation voltage (8 to 12 V) where the luminous efficiency of the singlet EL element becomes highest, and an operation voltage "b" indicates an operation voltage (3 to 5 V) where the luminous efficiency of the triplet EL element becomes highest.

At this time, as shown in the graph of FIG. 4, the triplet EL element has a feature that its luminous efficiency becomes highest when the operation voltage is lower than the singlet EL element. That is, the triplet EL element shows higher luminous efficiency than the singlet EL element in the operation region of low current density. This is not contradictory to the graph of FIG. 3 in which the triplet EL element shows higher luminous brightness than the singlet EL element in the operation region of low current density.

Here, from the characteristics of the triplet EL element shown in the graphs of FIGS. 3 and 4, relations in FIGS. 5 and 6 can be schematically derived. A graph of FIG. 5 shows a relation between electric power consumption and luminous efficiency in the triplet EL element, and it is understood that the luminous efficiency becomes low in the operation region of high electric power consumption. A graph of FIG. 6 shows a relation between electric power consumption and luminous brightness in the triplet EL element, and it is understood that an increasing rate of the luminous brightness is low in the operation region of high electric power consumption.

From the above, the present inventor has considered that it is desirable to make the triplet EL element emit light in the operation region of low current density. that is, in the operation region of low operation voltage.

Here, the driving principle of a passive matrix type light emitting device becomes a problem. In the case of the passive matrix type light emitting device, since only one selected pixel emits light, a time obtained by dividing one frame period (normally ⅟₆₀ second) by the number of pixels becomes a luminous time. That is, as the number of pixels becomes large and the fineness becomes high, a luminous time per pixel becomes short. Thus, in order to enable a bright and highly fine image display, the luminous brightness per pixel is raised, and a high density current must be made to flow instantaneously.

Accordingly, in the case where the triplet EL element is used for the passive matrix type light emitting device, light emission is made in the operation region of high current density in FIG. 3, that is, by the operation voltage higher than the operation voltage "b" in FIG. 4, and the light is made to emit in the operation region where the luminous efficiency is low. Accordingly, in order to obtain high luminous brightness, it is necessary that a higher current is made to flow, and as a result, the electric power consumption increases and the EL film is deteriorated.

From the above, the present inventor has considered that the passive matrix type light emitting device is disadvantageous to the light emission of the triplet EL element, and has found that an active matrix type light emitting device is most suitable for the triplet EL element. This is because a luminous time can be controlled by a semiconductor component in the active matrix type light emitting device, so that the density of current made to flow through the triplet EL element can be greatly suppressed.

Therefore, the inventor considers that the inventiveness of the present invention is in the point that the triplet EL element is combined with the active matrix type light emitting device as the most suitable light emitting device in view of the electric characteristics of the triplet EL element.

In the active matrix type light emitting device using the triplet EL element according to the present invention, when the operation voltage of the EL element is low, high luminous efficiency is obtained, so that it becomes possible to carry out a bright image display having high luminous brightness. Accordingly, the operation voltage may be made 10 V or less, preferably 7.5 V or less, more preferably 5 V or less. Besides, since it is expected that materials are further developed from now, it is conceivable that the operation voltage becomes 2.5 to 10 V.

Besides, in the active matrix type light emitting device, since the luminous time of the EL element can be made long, the operation voltage of the EL element can be set low when the same brightness (illuminance) as the passive matrix type light emitting device is secured. That is, the electric power consumption can be suppressed as compared with the passive matrix type light emitting device.

This point is schematically shown in FIGS. 7A and 7B. In FIG. 7A, the horizontal axis indicates the number of pixels included in a pixel portion, and the vertical axis indicates the luminous time in an arbitrary pixel. Incidentally, the luminous time in an arbitrary pixel is a time when the arbitrary one pixel continues emitting light, and here, in the case of the active matrix type (indicated by 701) and the case of the passive matrix type (indicated by 702), a time necessary to secure the same luminous brightness is considered as the luminous time.

The graph of FIG. 7A shows that when the number of pixels becomes large (becomes high fineness), the luminous times necessary to secure the same luminous brightness are different from each other between the passive matrix type and the active matrix type. That is, since the luminous time can be controlled by a semiconductor component in the active matrix type, the almost equal luminous time can be secured irrespective of the number of pixels. However, in the passive matrix type, when the number of pixels increases, the luminous time decreases.

Thus, in order to secure the same luminous brightness, the relation between the number of pixels and the current density becomes as shown in FIG. 7B. That is, in the case of the active matrix type (indicated by 703), even if the number of pixels becomes large, the current density may be almost constant and small. However, in the case of the passive matrix type (indicated by 704), when the number of pixels becomes large, the current density necessary to secure the luminous brightness greatly increases.

Therefore, when the number of pixels increases and high fineness is achieved, the active matrix type light emitting device in which the current density may be low, becomes advantageous in view of the suppression of electric power consumption as compared with the passive matrix type light emitting device.

Therefore, since the triplet EL element can obtain the most efficient light emission in the region of low operation voltage, when it is combined with the active matrix type light emitting device, it is possible to realize a light emitting device which has low electric power consumption and enables a bright image display. Further, since the operation voltage of the EL element is low, the density of current made to flow through the EL element may be low, so that the light emitting device having a long lifetime (high reliability) can be obtained.

DETAILED DESCRIPTION OF THE PREFERRED EMBODIMENTS

Embodiment Mode 1

Figure 1:
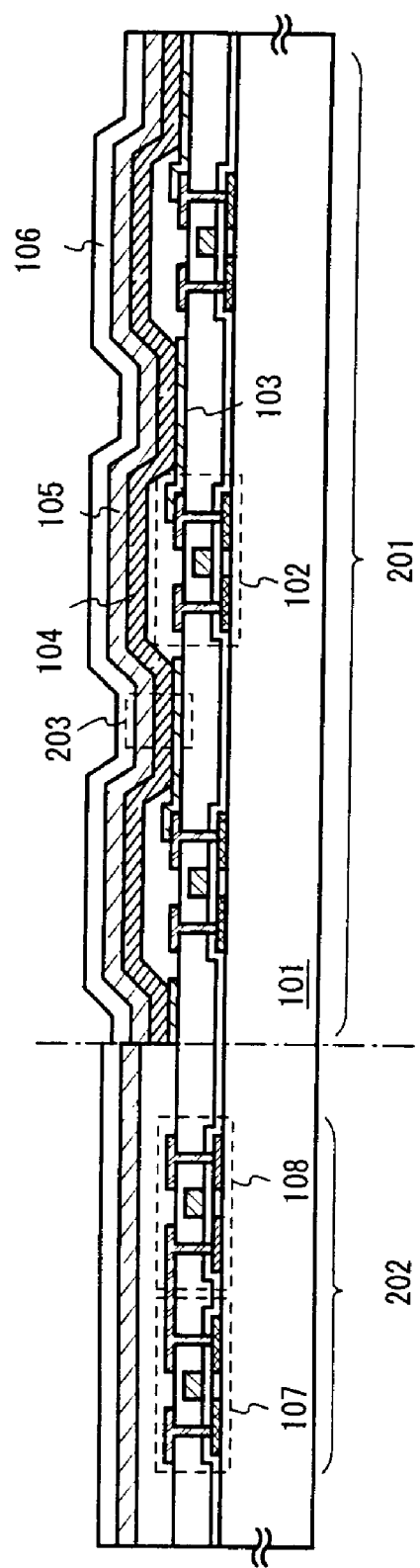
FIG. 1 is a view showing a sectional structure of a light emitting device.

An embodiment mode of the present invention will be described with reference to FIG. 1. FIG. 1 is a sectional view of an active matrix type light emitting device using a triplet EL element according to the present invention. Although a TFT is used here as a semiconductor component, the number of TFTs included in one pixel is not limited.

In FIG. 1, reference numeral 101 designates a substrate, and here. a substrate transparent to visible light is used. Specifically, a glass substrate, a quartz substrate. a crystallized glass substrate, or a plastic substrate (including a plastic film) may be used. Incidentally, the substrate 101 includes also an insulating film provided on the surface of the substrate.

A pixel portion 201 and a driving circuit 202 are provided on the substrate 101. First, the pixel portion 201 will be described.

The pixel portion 201 is a region where an image display is carried out, and includes a plurality of pixels. A TFT (hereinafter referred to as a current controlling TFT) 102 for controlling a current flowing through an EL element, and a triplet EL element 203 are provided in each of the pixels. Although only the current controlling TFT 102 is shown here, a TFT (hereinafter referred to as a switching TFT) for controlling a voltage applied to a gate of the current controlling TFT is provided.

Besides, it is preferable that a p-channel TFT is used for the current controlling TFT 102. Although an n-channel TFT can be used, in the case where the current controlling TFT is connected to an anode of the EL element as in the structure of FIG. 1, electric power consumption can be suppressed when the p-channel TFT is used. However, the switching TFT (not shown) may be an n-channel TFT or a p-channel TFT.

A pixel electrode 103 is electrically connected to a drain of the current controlling TFT 102. Here, since a conductive material having a work function of 4.5 to 5.5 eV is used as a material of the pixel electrode 103, the pixel electrode 103 functions as an anode of the triplet EL element 203. As the pixel electrode 103, typically, indium oxide, tin oxide, zinc oxide, or a compound of these may be used.

An EL layer 104 is provided on the pixel electrode 103. Incidentally, in the present specification, the EL layer generally indicates a layer where an organic material functioning as a hole injecting layer, a hole transporting layer, a hole blocking layer, an electron injecting layer, an electron transporting layer, or an electron blocking layer is laminated on an EL film (light emitting layer). However, the EL layer includes also a case where the EL film is used as a single layer.

The present invention is characterized in that a thin film made of a luminescent material in which light is emitted by triplet excitation is used as a light emitting layer. As such luminescent materials, a luminescent material set forth in the papers cited as the prior art can be used. Besides, as a layer structure of the EL layer 104, a layer structure set forth in the papers cited as the prior art can be used.

Besides, the present inventor considers that in addition to the luminescent materials set forth in the above papers, luminescent materials (specifically, metal complex or metal organic compound) expressed by the following molecular formulae can be used.

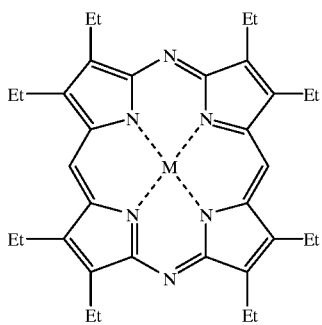

[Formula 1]

Et: ETYL GROUP
M: ELEMENT OF 8-10 FAMILIES IN PERIODIC TABLE

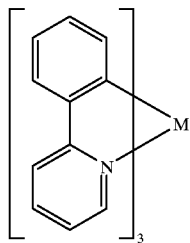

[Formula 2]

M: ELEMENT OF 8-10 FAMILIES IN PERIODIC TABLE

In the above molecular formulae, M designates an element belonging to groups 8 to 10 of the periodic table. In the above papers, platinum or iridium is used. However, the present inventor considers that iron, nickel, cobalt, or palladium is preferable. Since iron, nickel, cobalt and palladium are inexpensive as compared with platinum and iridium, they are effective in reduction of manufacturing cost of the light emitting device. Especially, nickel is preferable since a complex is easily formed and the productivity is also high.

Next, a cathode 105 is provided on the EL layer 104. As a material of the cathode 105, a conductive material having a work function of 2.5 to 3.5 eV is used. As the cathode 105, a conductive film typically containing an element belonging to group I or group II of the periodic table may be used.

The triplet EL element 203 made of the pixel electrode 103, the EL layer 104, and the cathode 105 is covered with a protection film 106. The protection film 106 is provided to protect the triplet EL element 203 against oxygen and water. As a material of the protection film 106, a silicon nitride film, a silicon nitride oxide film, an aluminum oxide film, a tantalum oxide film, or a carbon film (specifically, a diamond-like carbon film) is used.

Next, the driving circuit 202 will be described. The driving circuit 202 is a region for controlling timing of signals (gate signal and data signal) transmitted to the pixel portion 201, and is provided with a shift register, a buffer, a latch, an analog switch (transfer gate) or a level shifter. Here, a CMOS circuit made of an n-channel TFT 107 and a p-channel TFT 108 is shown as a basic unit of these circuits.

The circuit structure of the shift register, the buffer, the latch, the analog switch (transfer gate) or the level shifter may be a well-known one. In FIG. 1, although the pixel portion 201 and the driving circuit 202 are provided on the same substrate, it is also possible to connect an IC or an LSI without providing the driving circuit 202.

In the active matrix type light emitting device shown in FIG. 1, although a top gate type TFT (specifically, a planar type TFT) is mentioned as an example of the TFT, a bottom gate type TFT (specifically, a reverse stagger type TFT) may be used.

Here, although the anode of the triplet EL element 203 is electrically connected to the current controlling TFT 102, such a structure may be adopted that the cathode of the triplet EL element is electrically connected to the current controlling TFT. In that case, the pixel electrode is formed of a material used in the cathode 105, and the cathode is formed of a material used in the pixel electrode 103. In that case, it is preferable that the current controlling TFT is made as an n-channel TFT.

Figure 2A:
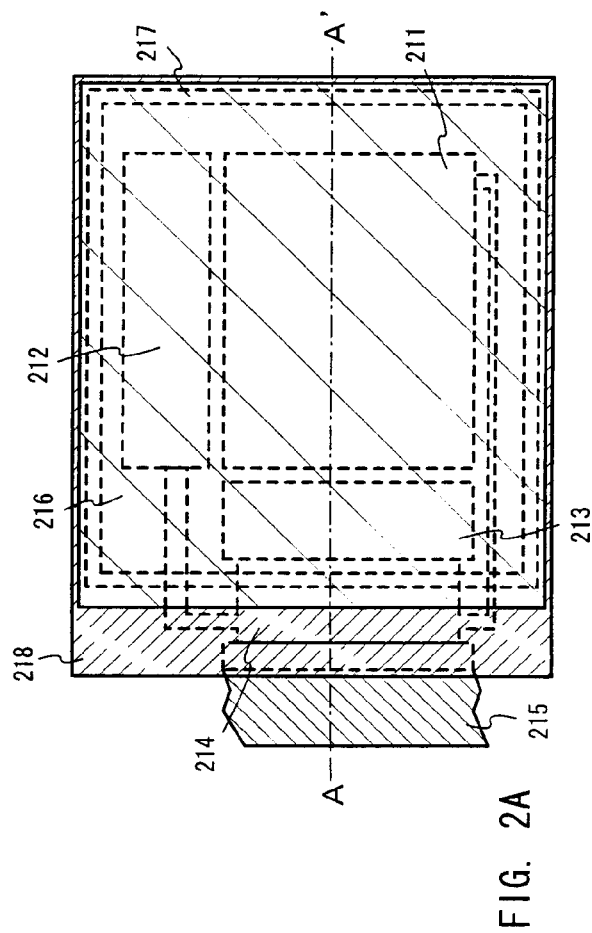
FIGS. 2A and 2B are views showing an upper structure and a sectional structure of a light emitting device.
Figure 2B:
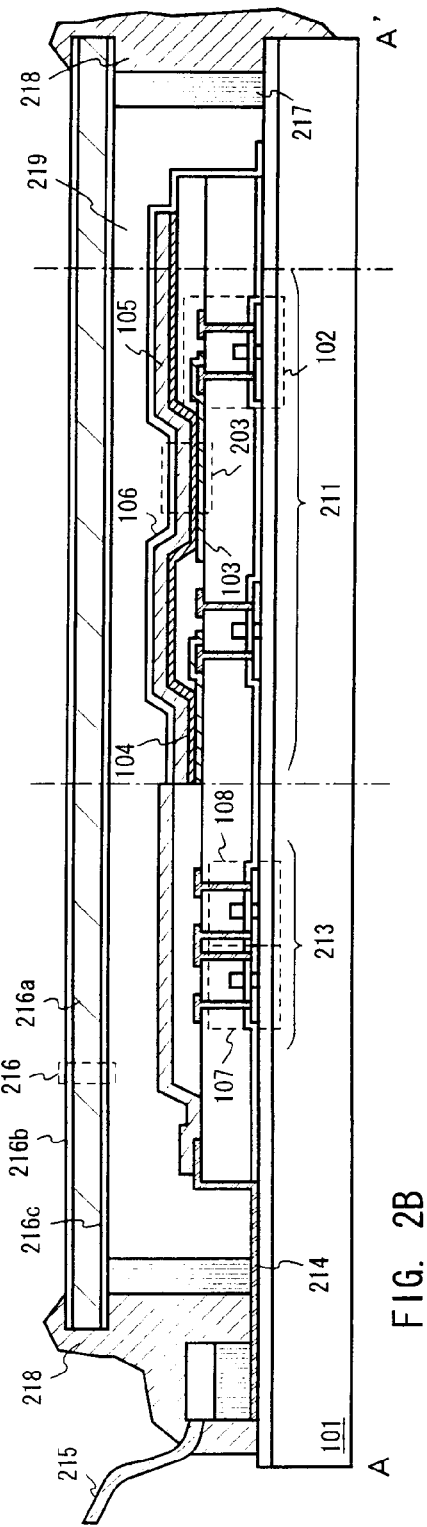
Figure 3:
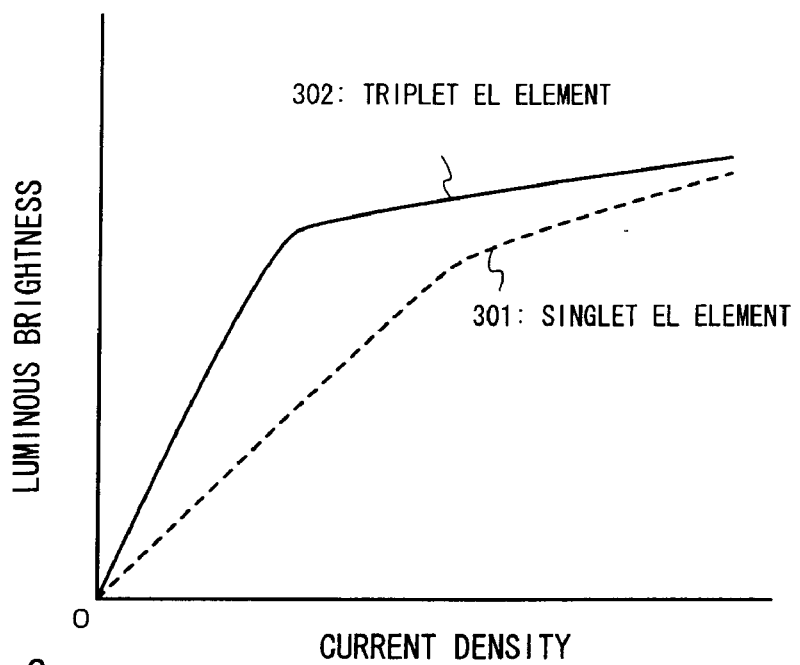
FIG. 3 is a view showing a relation between current density and luminous brightness.
Figure 4:
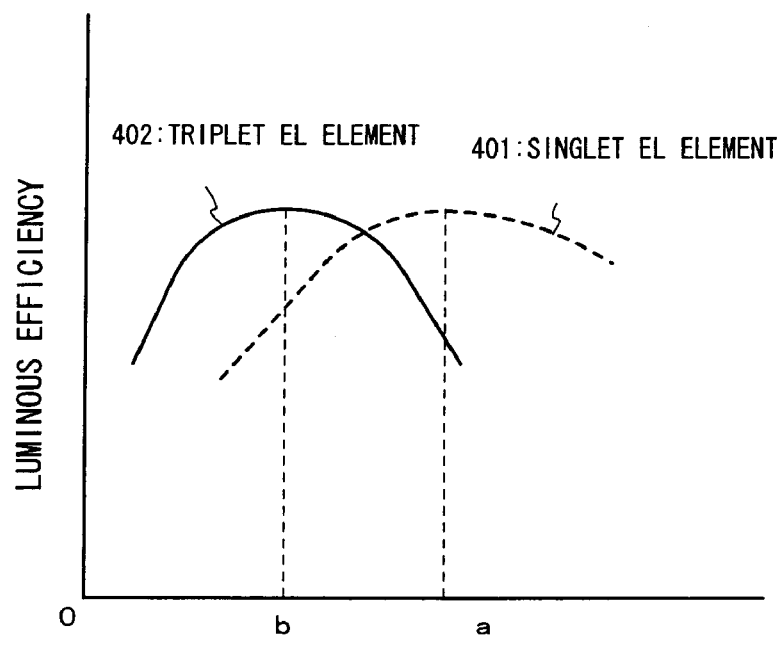
FIG. 4 is a view showing a relation between operation voltage and luminous efficiency.
Figure 5:
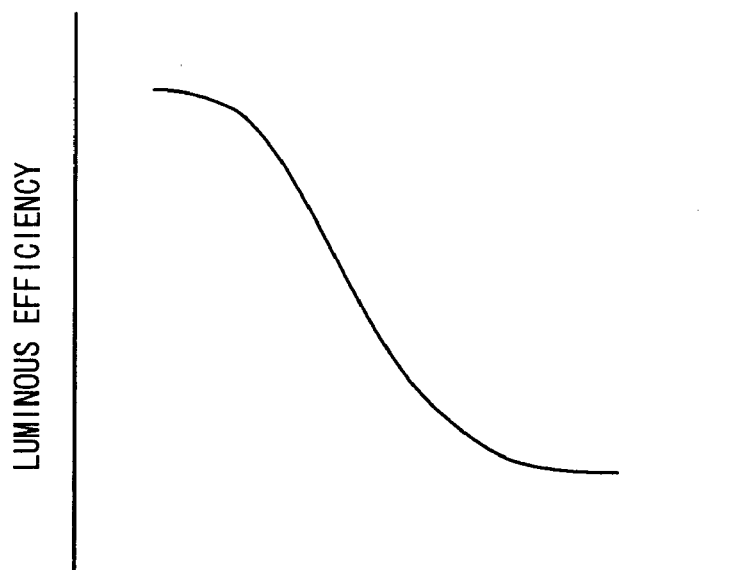
FIG. 5 is a view showing a relation between electric power consumption and luminous efficiency.
Figure 6:
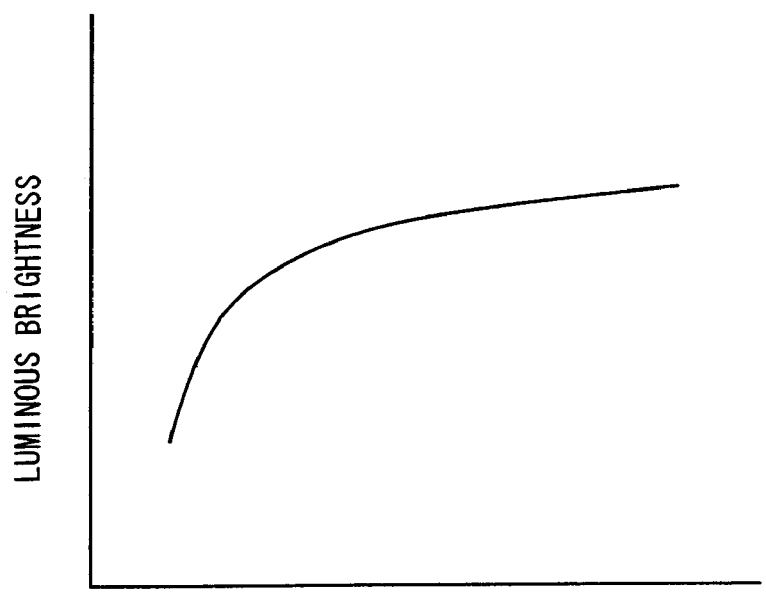
FIG. 6 is a view showing a relation between electric power consumption and luminous brightness.
Figure 7A:
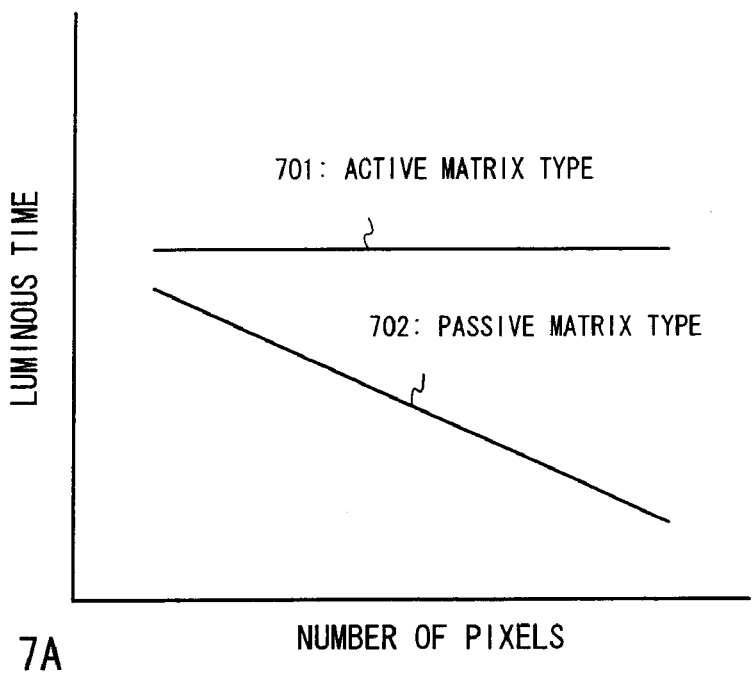
FIGS. 7A and 7B are views showing a relation between the number of pixels and luminous time and a relation between the number of pixels and current density.
Figure 7B:
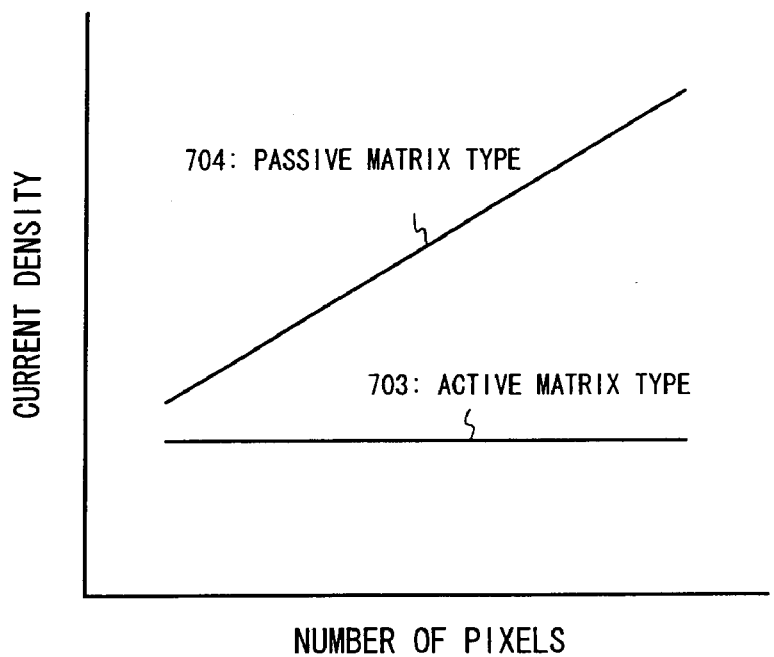

Here, the whole structure of the active matrix type light emitting device shown in FIG. 1 is shown in FIGS. 2A and 2B. FIG. 2A is a top view, and FIG. 2B is a sectional view cut along A—A' of FIG. 2A. Besides, the reference characters in FIG. 1 are used.

In FIG. 2A, reference numeral 211 designates a pixel portion; 212, a gate signal side drive circuit; and 213, a data signal side drive circuit. Signals transmitted to the gate signal side drive circuit 212 and the data signal side drive circuit 213 are inputted from an FPC (Flexible Printed Circuit) 215 through an input wiring line 214.

At this time, reference numeral 216 designates a cover member provided above the triplet EL element 203 shown in FIG. 1, and is bonded by a seal member 217 made of resin. Any material may be used for the cover member 216 as long as the material is impermeable to oxygen and water. Here, as shown in FIG. 2B, the cover member 216 is made of a plastic member 216a, and carbon films (specifically, diamond-like carbon films) 216b and 216c provided on the front surface and the back surface of the plastic member 216a.

Further, as shown in FIG. 2B, the seal member 217 is covered with an encapsulation member 218 made of resin, and the triplet EL element 203 is completely sealed in an airtight space 219. At this time, the airtight space 219 may be filled with an inert gas (typically, nitrogen gas or rare gas), a resin or an inert liquid (typically, liquid fluorocarbon typified by perfluoroalkane). Further, it is also effective to provide a moisture absorbent or a deoxidation agent.

The active matrix type light emitting device shown in this embodiment mode has a feature that a bright image display with low electric power consumption is enabled by using the triplet EL element as the light emitting element. Since the necessary operation voltage of the triplet EL element is low, the device also has a feature that the lifetime of the EL film is long and the reliability is high.

Embodiment Mode 2

In this embodiment mode, the description will be given of a case where an active matrix type light emitting device using a triplet EL element according to the present invention is operated in by digital driving. Incidentally, the digital driving is a driving method for carrying out an image display by using digital signals.

Besides, here, the description will be given of an example in which a time division method (time-sharing method) is used as a method of carrying out a gradation display. The time division method is a technique for visually enabling a plurality of gradation displays by combination of luminous times.

Figure 8A:
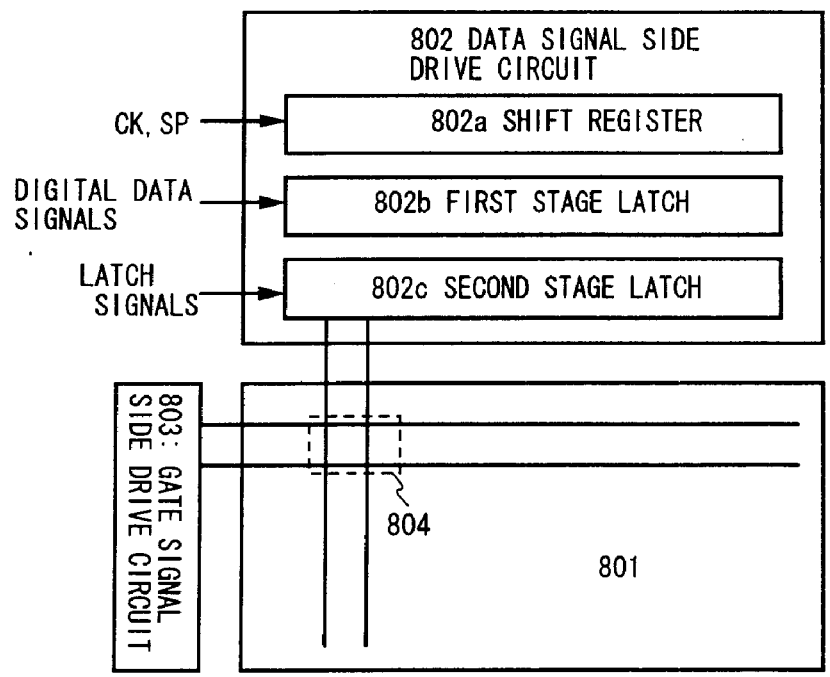
FIGS. 8A and 8B are views showing a circuit structure of a light emitting device and a pixel structure.

Here, when the digital driving is performed, in this embodiment mode, an active matrix type light emitting device of a circuit structure shown in FIG. 8A is adopted. In FIG. 8A, reference numeral 801 designates a pixel portion; 802, a data signal side drive circuit; and 803, a gate signal side drive circuit. The data signal side drive circuit 802 includes a shift register 802a, a first stage latch 802b, and a second stage latch 802c.

Figure 8B:
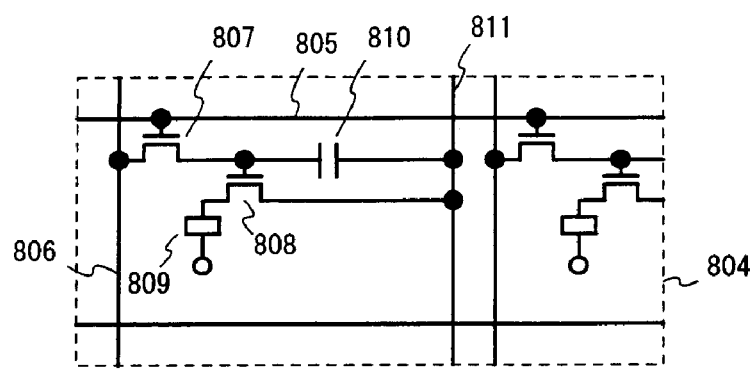

Besides, a plurality of pixels 804 are formed in the pixel portion 801. FIG. 8B is an enlarged view of the pixel 804. Reference numeral 805 designates a gate wiring line; 806, a data wiring line; 807, a switching TFT; 808, a current controlling TFT; 809, a triplet EL element; 810, a capacitor; and 811, a current supply line. Incidentally, the switching TFT 807 and the current controlling TFT 808 may be respectively made to have multigate structure in which a plurality of channel formation regions are provided between a source region and a drain region. Especially, it is effective that the switching TFT 807 is made to have the multigate structure in view of the suppression of an off current (drain current flowing when the TFT is in an off state).

In the pixel of the above structure, a data signal transmitted to the data wiring line 806 is charged in the capacitor 810 when the gate of the switching TFT 807 is opened. Besides, this data signal is applied to the gate of the current controlling TFT 808, and when the gate of the current controlling TFT 808 opens, a signal transmitted to the current supply line 811 is applied to the EL element 809. In this way, a predetermined voltage is applied to the EL element 809 and light emission occurs.

Next, an example in which the gradation display is carried out by the time division method will be described. Here, the description will be given of an example in which a full color display of 256 gradations (16.77 million colors) is carried out by an 8-bit digital driving system.

First, one frame of an image is divided into eight fields. Incidentally, one period when data is inputted to all pixels of a display region is called one frame, and in a normal EL display, an oscillation frequency is 60 Hz, that is, 60 frames are formed in one second. Further, a frame obtained by further dividing one frame into plural parts is called a field.

One field is divided into an address period (Ta) and a sustain period (Ts). The address period indicates the whole time required for inputting data into all pixels in one field period, and the sustain period (may also be called a lighting period) indicates a period when an EL element is made to emit light.

Here, a first field is called F1, and subsequently, a second field to an eighth field are called F2 to F8. The address periods (Ta) are constant from F1 to F8. On the other hand, the sustain periods (Ts) of F1 to F8 are respectively made Ts1 to Ts8.

At this time, the sustain periods are set to establish Ts1:Ts2:Ts3:Ts4:Ts5:Ts6:Ts7:Ts8= 1:½:¼:⅛:1/16:1/32:1/64:1/128. However, the sequence of the appearance of F1 to F8 may be random. By the combination of the sustain periods, a desired gradation display can be carried out among 256 gradations.

First, in a state where a voltage is not applied (selected) to an electrode of the EL element at a side where it is not connected to the TFT, data signals are inputted to the respective pixels without making the EL element emit light. This period is the address period. When the data is inputted to all pixels and the address period is ended, a voltage is applied (selected) to the electrode to make the EL element emit light at the same time. This period is the sustain period. The period of light emission (pixel is lighted) is any one of the periods Ts1 to Ts8. Here, it is assumed that a predetermined pixel is lighted in the period Ts8.

Next, again in the address period, data signals are inputted to all pixels, and then the sustain period starts. At this time, any one of the periods Ts1 to Ts7 becomes the sustain period. Here, it is assumed that a predetermined pixel is lighted in the period Ts7.

Subsequently, a similar operation is repeated with respect to remaining six fields, and it is assumed that the sustain periods are sequentially set as Ts6, Ts5. . . Ts1, and predetermined pixels are lighted in the respective fields.

When the eight fields appear, one frame is ended. At this time, the gradation of the pixel is controlled by the addition of the sustain periods. For example, in the case where Ts1 and Ts2 are selected, when the whole lighting is made as 100%, brightness of 75% can be expressed, and in the case where Ts3, Ts5 and Ts8 are selected, brightness of 16% can be expressed.

Figure 9:
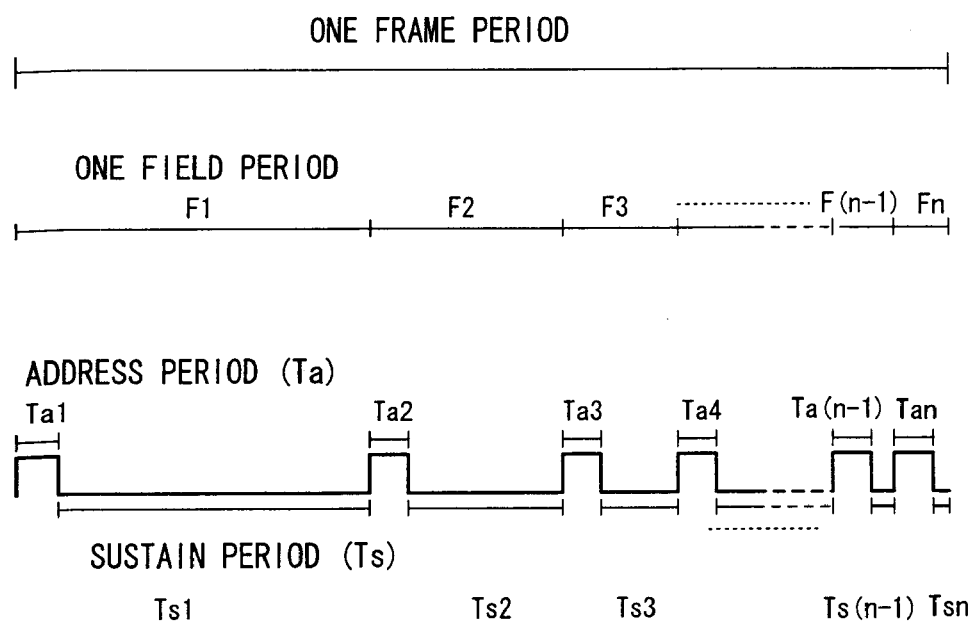
FIG. 9 is a view for explaining an operation of gradation display by a time division method.

Although the description has been given of the case of 256 gradations, another gradation display can also be carried out. Next, the case where an n-bit gradation display is carried out will be described with reference to FIG. 9.

In the case where a display of n-bit (n is an integer of two or more) gradations ($2^n$ gradations) is carried out, first, one frame is made to correspond to the n-bit gradations and is divided into n fields (expressed by F1, F2, F3 . . . F(n−1), F(n)). As the number of gradations becomes large, the division number of one frame is also increased, and the driving circuit must be driven at high frequency.

Further, each of these n fields is divided into an address period (Ta) and a sustain period (Ts). That is, by selecting whether or not a voltage is applied to an electrode (electrode at the side where it is not connected to the TFT) common to all EL elements, the address period and the sustain period are selected.

Then, the sustain periods of the respective n fields (sustain periods corresponding to F1, F2, F3 . . . F(n−1), F(n) are respectively expressed by Ts1, Ts2, Ts3 . . . Ts(n−1), Ts(n)) are processed to establish Ts1:Ts2:Ts3: . . . :Ts(n−1):Ts(n)= $2^0:2^{-2}. \ldots :2^{-(n-2)}:2^{-(n-1)}$.

In this state, in an arbitrary field, a pixel is sequentially selected (strictly speaking, a switching TFT of each pixel is selected), and a predetermined gate voltage (corresponding to a data signal) is added to the gate of the current controlling TFT. At this time, an EL element of pixel in which a data signal to make the current controlling TFT have a conductive state is inputted, emits light only in the sustain period allocated to the field after the address period is ended, that is, a predetermined pixel is lighted.

This operation is repeated for all of the n fields, and the gradation of each pixel is controlled by the addition of the sustain periods. Accordingly, when attention is paid to one arbitrary pixel, the gradation of the one pixel is controlled according to how long the pixel is lighted in each field (via how many sustain periods).

By the technique as described above, the time division gradation display becomes possible. In order to carry out the gradation display by the time division method, digital driving is desirable. Since the EL element has high responsibility to an electric signal, it is advantageous when the time division method is used.

However, the present invention is not limited to the above driving method, but analog driving (driving method using analog signals) may be used, and in addition to the time division method, the gradation display may be carried out by using an area division method (also called an area gradation). In the case of the analog driving, a voltage gradation method by analog signals may be used.

The driving method described in this embodiment mode of the present invention can be used as a driving method of the light emitting device described in Embodiment Mode 1.

Embodiment Mode 3

In this embodiment mode, an example in which the present invention is applied to an active matrix type light emitting device having such a pixel structure that three semiconductor components are provided in one pixel, will be described with reference to FIG. 10.

Figure 10:
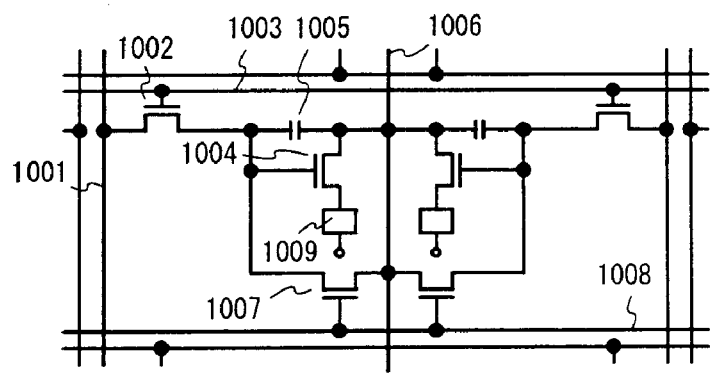
FIG. 10 is a view showing a pixel structure of a light emitting device.

In FIG. 10, reference numeral 1001 designates a source wiring line of a switching TFT 1002; 1003, a gate wiring line of the switching TFT 1002; 1004, a current controlling TFT; 1005, a capacitor (may be omitted); 1006, a current supply line; 1007, an erasing TFT; 1008, an erasing gate wiring line; and 1009, a triplet EL element. Incidentally, with respect to the operation of the erasing TFT 1007 and the pixel structure, Japanese Patent Application No. Hei. 11-338786 can be cited.

The drain of the erasing TFT 1007 is connected to the gate of the current controlling TFT 1004, and the gate voltage of the current controlling TFT 1004 can be forcibly changed. Although the erasing TFT 1007 may be an n-channel TFT or a p-channel TFT, it is desirable to make the erasing TFT 1007 have the same structure as the switching TFT 1002 so that an off current can be made low.

Besides, in FIG. 10, there is also a feature that the current supply line 1006 is made common to two pixels. That is, the two pixels are formed to be axially symmetrical with respect to the current supply line 1006. In this case, since the number of current supply lines can be reduced, the pixel portion can be made to have higher fineness.

Incidentally, this embodiment mode can be carried out in combination with Embodiment Mode 1 or Embodiment Mode 2.

Embodiment Mode 4

In this embodiment mode, an example in which the present invention is applied to an active matrix type light emitting device having such a pixel structure that four semiconductor components are provided for one pixel. will be described with reference to FIG. 11.

Figure 11:
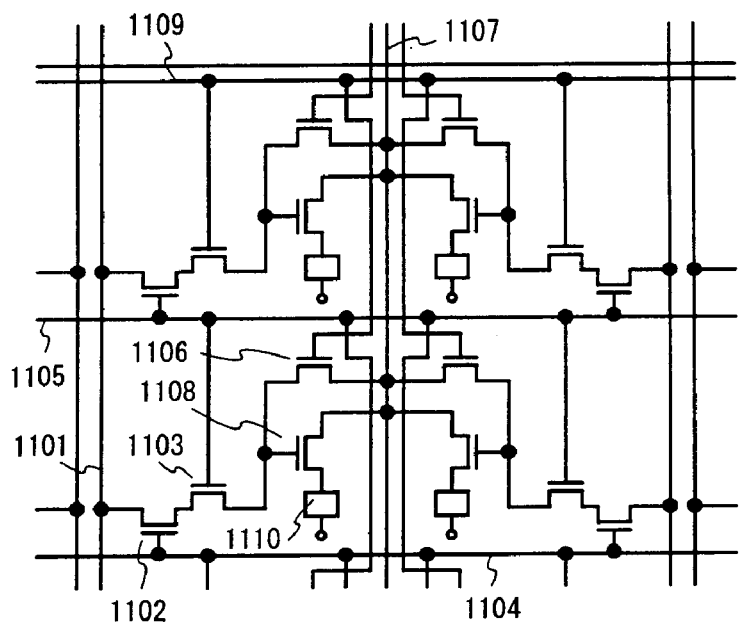
FIG. 11 is a view showing a pixel structure of a light emitting device.

In FIG. 11, reference numeral 1101 designates a source wiring line of a first switching TFT 1102; and 1103, a second switching TFT connected in series to the first switching TFT 1102 (connected to a drain). Reference numeral 1104 designates a (i+1)th gate wiring line connected to the gate of the switching TFT 1102; and 1105, an ith gate wiring line connected to the gate of the switching TFT 1103.

Reference numeral 1106 designates an erasing TFT. The source of the erasing TFT 1106 is connected to a current supply line 1107, and the gate of a current controlling TFT 1108 is connected to the drain of the second switching TFT 1103. The gate of the erasing TFT 1106 is connected to an (i−1)th gate wiring line 1109. The source of the current controlling TFT 1108 is connected to the current supply line 1107, and its drain is connected to a triplet EL element 1110.

At this time, the drain of the erasing TFT 1106 is connected to the gate of the current controlling TFT 1108, so that the gate voltage of the current controlling TFT 1108 can be forcibly changed. The erasing TFT 1106 may be an n-channel TFT or a p-channel TFT.

Different points from the pixel structure of Japanese Patent Application No. Hei. 11-338786 described in Embodiment Mode 3 are that the switching TFT is divided into the first switching TFT 1102 and the second switching TFT 1103, and the gate of the first switching TFT 1102 is connected to the gate wiring line of a next adjacent line, that is, the (i+1)th gate wiring line, and that the gate of the erasing TFT 1106 is connected to the gate wiring line of an adjacent prior line, that is, the (i−1)th gate wiring line.

Figure 12A:
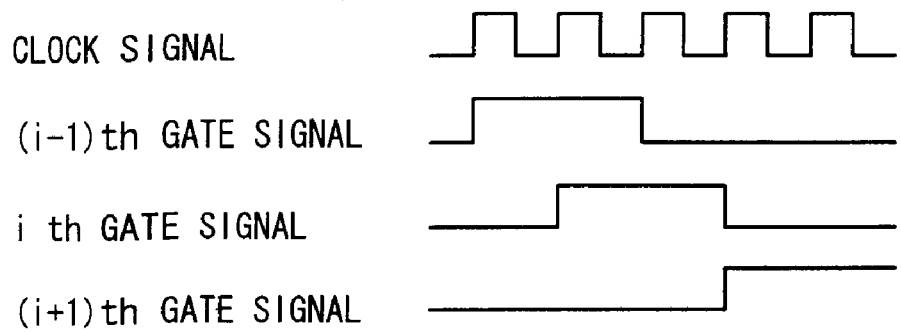
FIGS. 12A and 12B are views showing timing charts of signals inputted to gate wiring lines.
Figure 12B:
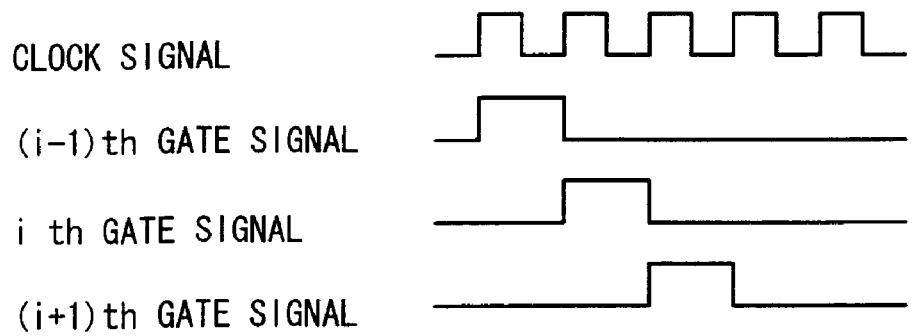

In the case where the pixel structure of FIG. 11 is adopted, by contriving gate signals inputted to the (i−1)th gate wiring line, the ith gate wiring line, and the (i+1)th gate wiring line, a similar effect to the pixel structure disclosed in Japanese Patent Application No. Hei. 11-338786 can be obtained. Here, FIG. 12A is a timing chart of gate signals when a data signal is written in a pixel, and FIG. 12B is a timing chart of gate signals when a data signal is erased from a pixel.

According to this embodiment mode of the present invention, since the erasing gate wiring line 1108 shown in FIG. 10 can be omitted, an effective light emitting region of a pixel can be increased, and a driving circuit for driving the erasing gate wiring line 1008 can be omitted, so that such an effect that manufacturing yield is improved can be expected.

Incidentally, this embodiment mode of the present invention can be carried out in combination with Embodiment Mode 1 or Embodiment Mode 2.

Embodiment Mode 5

In the structure of a light emitting device of the present invention, the number of TFTs in one pixel may be arbitrary. Although Embodiment Mode 3 shows the example in which three TFTs are provided, and Embodiment Mode 4 shows the example in which four TFTs are provided, a pixel structure in which more TFTs are provided may be adopted.

Incidentally, this embodiment mode of the present invention can be carried out in combination with Embodiment Mode 1 or Embodiment Mode 2.

Embodiment Mode 6

Since the light emitting device of the present invention has advantages that it is bright and has low electric power consumption and high reliability, it can be used as a light source for various electrical appliances.

Typically, the device can be employed as a light source used as a backlight or a frontlight of a liquid crystal display device, or as a light source of an illuminating equipment.

Incidentally, this embodiment mode of the present invention can be carried out in combination with any structure of Embodiment Mode 1 to Embodiment Mode 5.

EMBODIMENTS

Embodiment 1

Figure 15:
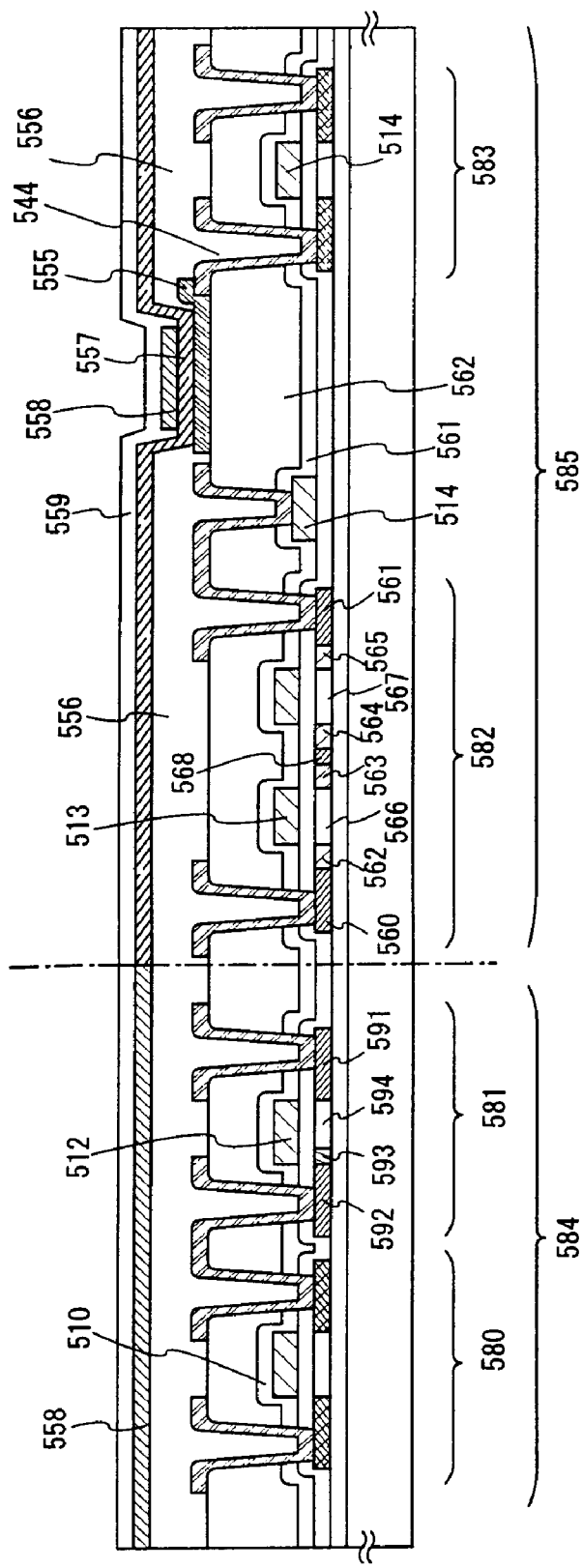
FIG. 15 is a sectional view showing an example of an active matrix type light emitting device.

In this embodiment, an example of an active matrix type light emitting device using a triplet EL component is described referring to FIG. 15. The active matrix type light emitting device shown in FIG. 15 is formed with a pixel portion 585 and a driver circuit 584 which outputs a signal to the pixel portion. In the pixel portion 585 there are provided a switching FT 582 and a driver TFT 583, and in the driver circuit there are provided a p-channel TFT 580 and an n-channel TFT 581.

In the pixel portion 585, the semiconductor layer of the switching TFT 582 has as an n-type impurity region a source region 560 and drain regions 561 and 568 and LDD regions 562 to 565. This TFT has a multi gate structure and is formed with channel forming regions 566 and 567 by the gate electrode 513 on the gate insulating film 510. Further, LDD regions 562 to 565 are provided in positions that do not overlap with the gate electrode 513, and is a structure which aims to decrease the off-current of the TFT.

The n-channel TFT 581 of the driver circuit 584 has a source region 591, a drain region 592, a channel forming region 594, and on the drain region 592 side an LDD region 593 formed. The LDD region 593 is provided in a position overlapping the gate electrode 512, and is a structure which suppresses degradation due to a hot carrier effect. This n-channel TFT 581 does not have to take into account the off-current very much, but rather is designed with more importance on the operation speed. Further, to increase the current driving ability, the LDD region 593 is completely overlapped with the gate electrode 512, so that serial resistance loss is suppressed as much as possible. On the other hand, the p-channel TFT 580 may mostly ignore degradation due to the hot carrier effect, so that it is not necessary to particularly provide an LDD region and therefore a single drain structure is used.

The triplet EL component is formed on an interlayer insulating film with a lamination structure of a silicon nitride film 561 with a thickness of 50 nm and an acrylic 562 with a thickness of 1000 nm. The silicon nitride film is used to prevent ionic impurity mixing into the semiconductor layer from the outside. The acryl is used for leveling and other organic resin material of a thermal hardening type or a light hardening type such as polyamide, polyamide, and BCB (benzocyclobutene) may be used in place. An organic resin film such as acryl is hygroscopic so that it is preferable to reform the surface by a plasma processing to make it compact. Further, by this processing, an effect of preventing alkaline metallic material, such as lithium used as a cathode material of an EL component, from scattering in the semiconductor layer may be expected.

An anode 555 of the triplet EL component is formed by indium and tin oxide (ITO). The anode 555 is connected to the drain wiring 544 of the driver TFT 583. The bank 556 which separates the adjacent pixels is formed by forming a photosensitive acryl on the anode 555 and the acryl 562, and forming an opening in accordance with the position of the anode 555. This bank 556 covers the end portion of the anode 555 and is formed with an inclination of the side surface to be 30° or more, preferably 45°. Further, with the bank 556 provided on the portion to which a drain wiring 544 of the anode 555 and the driver TFT 583 are connected to, the light emission failure of the EL layer 557 due to the step which occurs in the portion of the contact hole is prevented. Note that, by mixing resin or the like to the resin material forming the bank 556, the bank 556 may be used also as a light shielding film.

Then, an EL layer 557 including a light emitting material which emits light by triplet excitation as shown in Embodiment Mode 1, and a cathode (an MgAg or AlLi electrode) 558 is formed using a vacuum evaporation method. These two layers are preferably formed continuously without exposure to the atmosphere. Note that, the film thickness of the EL layer 557 is 80 to 200 nm(typically 100 to 120 nm), and the thickness of the cathode 558 is 180 to 300 nm (typically 200 to 250 nm). Note that, in this embodiment only one pixel is shown but at the same time, the EL layer emitting ref light, the EL layer emitting green light and the EL layer emitting blue light are formed.

Note that, in this embodiment the EL layer 557 may be a single layer structure made from only light emitting layers, or may be provided with such as a hole transporting layer, a hole injecting layer, an electron transporting layer, an electron injecting layer, or the like in addition to the light emitting layer. Such a combination is already reported in various examples and any structure may be used.

Further, after the cathode 557 is formed, as a passivation film 559 a DLC (diamond like carbon) or a silicon nitride film is formed.

The active matrix type light emitting device shown in FIG. 15 is further high in air tightness so as not to be exposed to the outside air, and is packaged (sealed) by a transparent sealing member or a protecting film with little degassing (a laminate film, a UV cured resin film or the like). At that time, the reliability of the EL component is improved when the inside of the sealing member is made an inert atmosphere or a hygroscopic material (for example barium oxide) is placed inside.

Further, when air tightness is heightened by a process such as packaging, a connector (flexible print circuit: FPC) for connecting the terminal lead out from the component or the circuit formed on the substrate and the external signal terminal are mounted to thereby complete the product. Such a state until the shipment is referred to as an EL display (EL module) in this specification.

Embodiment 2

Figure 16:
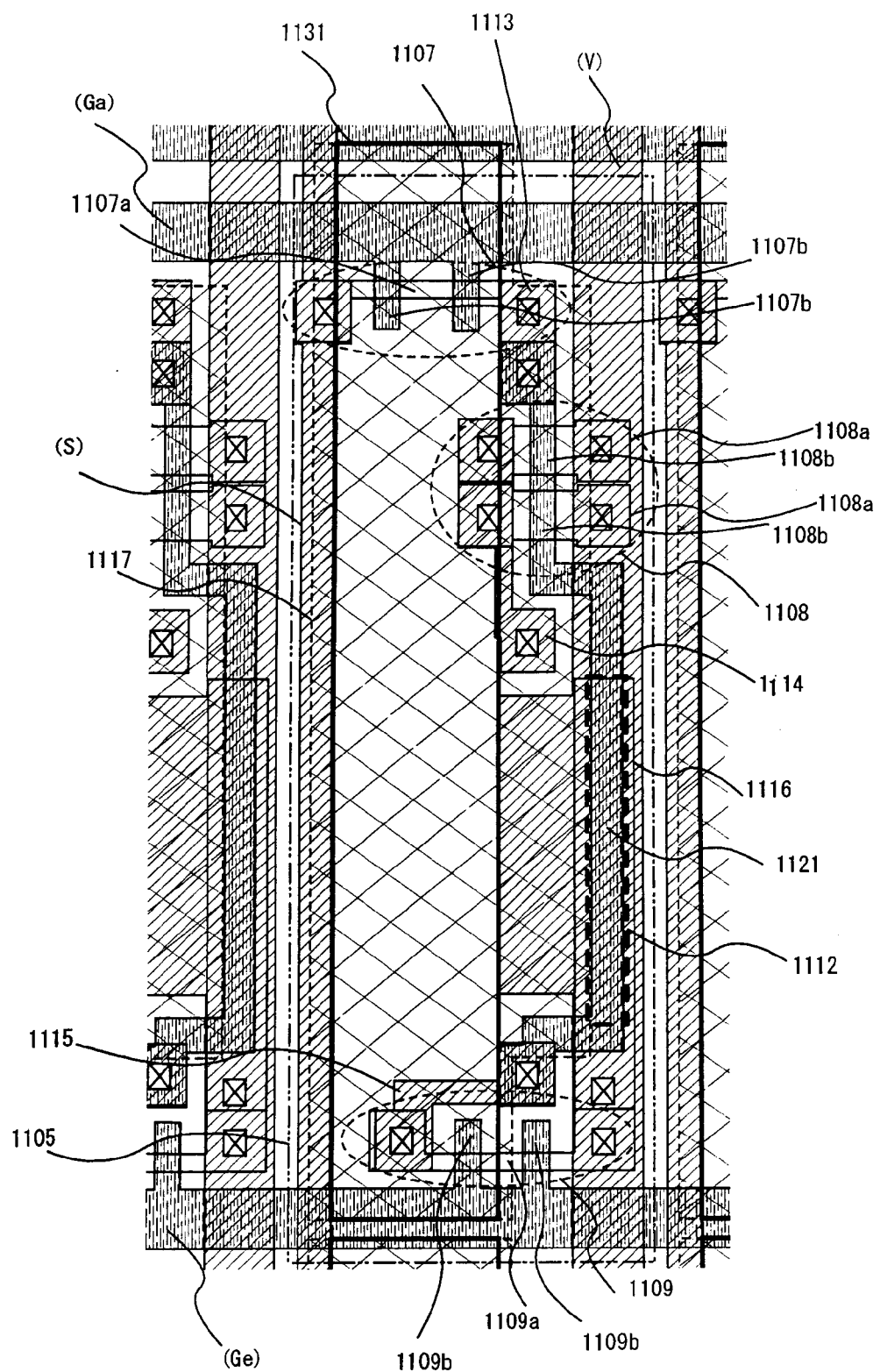
FIG. 16 is a top view showing a structure of a pixel portion of an active matrix type light emitting device.

A circuit diagram of the pixel of the active matrix type light emitting device is shown in FIG. 16. Reference numeral 1107 denotes a switching TFT, reference numeral 1108 denotes a driver TFT, reference numeral 1109 denotes an erasure TFT, reference numeral 1110 denotes an EL element, reference numeral 1111 denotes an opposing power source, and reference numeral 1112 is a capacitor. The driver TFT 1108 is one in which two EL driver TFTs (a first EL driver TFT and a second EL driver TFT) are connected in parallel. The first EL driver TFT and the second EL driver TFT are combined and referred to as the driver TFT in this specification.

A gate electrode of the switching TFT 1107 is connected to a write in gate signal line Ga (one of the write in gate signal lines Ga1 to Gay). One of a source region and a drain region of the switching TFT 1107 is connected to a source signal line S (one of the source signal lines S1 to Sx), and the other is connected to a gate electrode of the driver TFT 1108, to the capacitor 1112 of each pixel, and to a source region or a drain region of the erasure TFT 09.

The capacitor 1112 is provided so as to retain a gate voltage of the driver TFT 1108 when the switching TFT 1107 is in a non-selected state (OFF state). Although the structure in which the capacitor 112 is provided is shown in this embodiment. the present invention is not limited thereto and the structure in which the capacitor 1112 is not provided may also be employed.

One of a source region of the driver TFT 1108 is connected to a power source supply line V (any one of V1 through Vx), and a drain region is connected to an EL element 1110. The power source supply line V is connected to the capacitor 1112.

From among the source region and the drain region of the erasure TFT 1109, the one which is not connected to the gate electrode of the driver TFT 1108 is connected to the power source supply line V. The gate electrode of the erasure TFT 1109 is connected to an erasure gate signal line Ge (any one of Ge1 through Gey).

The EL element 1110 includes an anode, a cathode and an EL layer provided between the anode and the cathode. In the case where the anode is connected to the drain region of the driver TFT 1108, the anode serves as a pixel electrode while the cathode serves as an opposing electrode. On the contrary, in the case where the cathode is connected to the drain region of the driver TFT 1108, the cathode serves as a pixel electrode while the anode serves as an opposing electrode.

The opposing electrode of the EL element 1110 is connected to the opposing power source 1111 formed externally to the substrate having the pixel portion 101, and an opposing electric potential is always applied. Further, the power source supply line V is connected to an power source (not shown in the figure) formed externally to the substrate having the pixel portion 101, and a power source electric potential is always applied. The opposing electric potential and the power source electric potential are always maintained at an electric potential difference on an order such that the EL element emits light when the power source electric potential is applied to the pixel electrode.

For an EL display using a triplet EL element, in the case where the amount of light per area of a pixel portion is 200 cd/m$^2$, about 0.5 to 1 mA/cm$^2$ of a current per area of a pixel portion is needed. Therefore, when the size of the pixel portion is increased, it becomes difficult to control the electric potential applied from the power source to the power source supply line by a switch. In the present invention, however, the power source electric potential and the opposing electric potential are always held constant. Therefore, since it is not necessary to control the electric potential level applied from the power source provided in the IC by a switch, the present invention is effective to realize a panel having a larger screen size.

The switching TFT 1107, the driver TFT 1108, and the erasure TFT 1109 can use both n-channel TFTs and p-channel TFTs. However, it is necessary that the first driver TFT and the second driver TFT have the same polarity. It is preferable that the driver TFT 1108 be a p-channel TFT for cases in which the anode of the EL element 1110 is the pixel electrode and the cathode is the opposing electrode. Conversely, it is preferable that the driver TFT 1108 be an n-channel TFT when the anode of the EL element 1110 is the opposing electrode and the cathode is the pixel electrode.

Further, the switching TFT 1107, the driver TFT 1108, and the erasure TFT 1109 may have, in addition to a single gate structure, a multi-gate structure such as a double gate structure or a triple gate structure.

Figure 17:
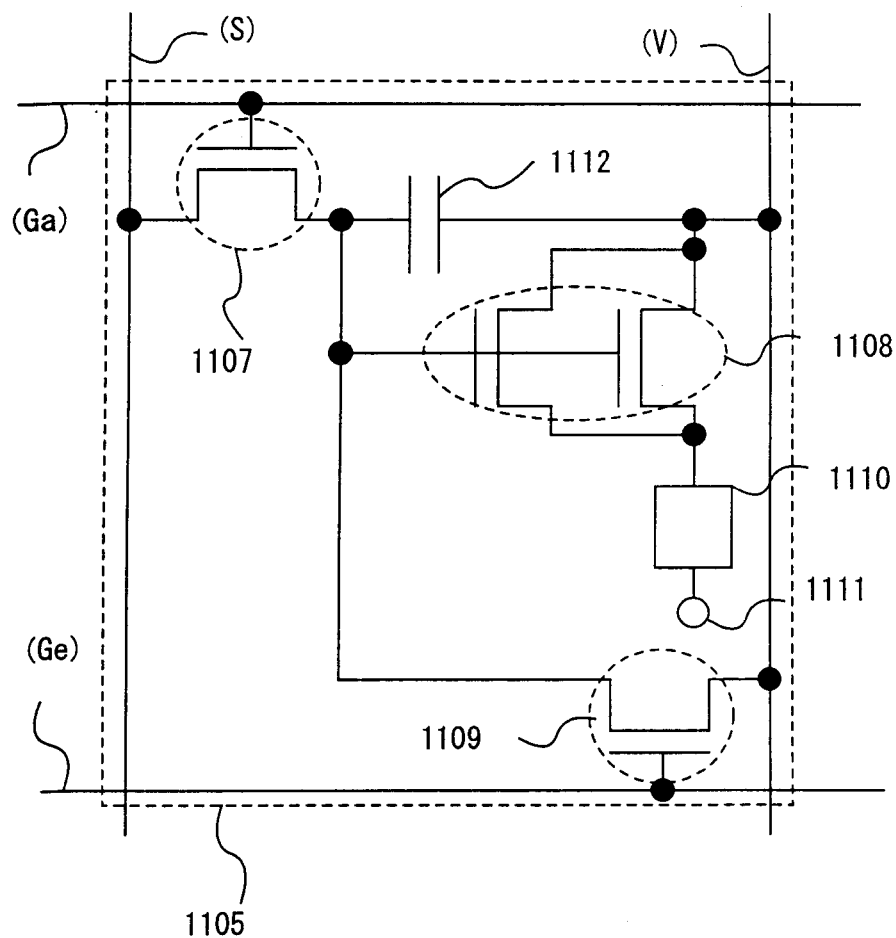
FIG. 17 is an equivalent circuit diagram of a pixel portion of an active matrix type light emitting device.

A top surface diagram of the pixel of the EL display shown in FIG. 16 of the present invention is described with reference to FIG. 17. Common reference numerals are used in FIG. 16 and FIG. 17.

The region 1105 having one each of a source signal line (S), a power source supply line (V), a write in gate signal line (Ga), and an erasure gate signal line (Ge) in FIG. 16 is a pixel. The pixel 1105 has the switching TFT 1107, the driver TFT 1108, and the erasure TFT 1109. The driver TFT 1108 has the first and the second EL driver TFT, and the first and the second EL driver TFTs are connected in parallel.

The switching TFT 1107 has a semiconductor layer 1107a, and a gate electrode 1107b which is a portion of the write in gate signal line (Ga). The driver TFT 1108 has a semiconductor layer 1108a, and a gate electrode 1108b which is a portion of a gate wiring 1121. The erasure TFT 1109 has a semiconductor layer 1109a, and a gate electrode 1109b which is a portion of the write in gate signal line (Ge).

One of a source region and a drain region of the semiconductor layer 1107a of the switching TFT 1107 is connected to the source signal line, and the other of the source region and the drain region is connected to the gate wiring 1121 through a connection wiring 1113. Note that, the connection wiring 1113 is referred to as a source wiring and as a drain wiring, depending on the electric potential of the source signal line (S).

One of a source region and a drain region of the semiconductor layer 1109a of the erasure TFT 1109 is connected to the source signal line, and the other of the source region and the drain region is connected to the gate wiring 1121 through a connection wiring 1115. Note that, the connection wiring 1113 is referred to as a source wiring and as a drain wiring, depending on the power source electric potential of power source electric potential.

A source region and a drain region of the semiconductor layer 1108a of the driver TFT 1108 are connected to the power source supply line V and to a drain wiring 1114, respectively. The drain wiring 1114 is connected to an anode 1117.

A capacitor wiring 1116 is formed by a semiconductor film. The capacitor 1112 is formed by the capacitor wiring 1116, which is electrically connected to the power source supply line (V), and between an insulating film (not shown in the figures) on the same layer as the gate insulating film and the gate wiring 1121. Further, it is also possible to use a capacitance formed by the gate wiring 1121. a layer (not shown in the figures) which is the same as the first interlayer insulating film, and the power source supply line (V).

Note that, a bank having an opening 1131 is formed on the anode 1117 by etching an organic resin film. The EL layers and the opposing electrode are then laminated in order on the pixel electrode 1117, although not shown in the figure. The anode 1105 and the EL layer contact in the opening 1131 of the bank, and the EL layer emits light only in a portion sandwiched by the contacting opposing electrode and the pixel electrode.

Note that, the pixel portion of the EL display of the present invention is not limited to the structure shown in FIG. 16.

Embodiment 3

The superiority of the triplet EL element in respect to the singlet EL element is in that a high precision may be obtained with low voltage. Here, a test example of applying the EL element to the active matrix type light emitting device is shown.

As a triplet EL element and an anode, a copper phthalocyanine (hereinafter referred to as CuPc), 4,4',4"-tris (N-3-methylphenyl-N-phenyl-amino) triphenylamine (hereinafter referred to as mTDATA) which is an aromatic amine material, 4,4'-bis [N-naphthyl-N pheny-amino] biphenyl (hereinafter referred to as α-NPD), 4,4' N,N'-dicaribazole-biphenyl (hereinafter referred to as CBP) added with tris-(2-phenyl-pyridine and iridium (hereinafter referred to as Ir (ppy)$_3$), bathocuproine (hereinafter referred to as BCP), an aluminum complex of oxine (hereinafter referred to as Alq$_3$) are laminated subsequently to fabricate the sample. CBP added with Ir (ppy)$_3$ is an organic compound where light emission (fluorescence) may be obtained from a triplet excited state.

As a comparative example, a singlet EL element is formed which is formed with a hole injecting layer made of CuPc, a hole transporting layer formed of mTDATA and α-NPD and an electron injecting layer as well as a light emitting layer formed of Alq$_3$ on an anode formed by ITO.

Figure 18:
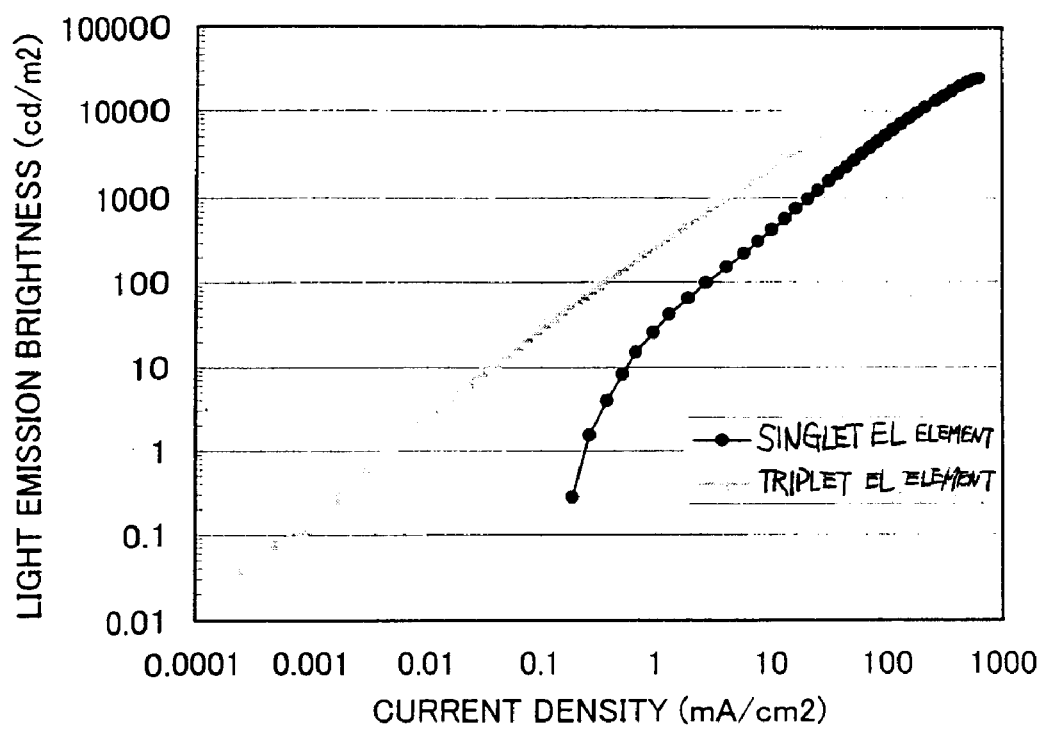
FIG. 18 is a graph showing characteristics of current density versus brightness in a triplet EL element and a singlet EL element.

FIG. 18 is a graph showing the characteristics of a current density with the light emission brightness. The triplet EL element obtains high light emission brightness from a low current density, and in comparison has a brightness five to ten times in the same current density. This tendency is particularly significant in a region with low current density. Further, in the range measured here, the brightness is increases almost in a straight with the increase of the current density.

Figure 19:
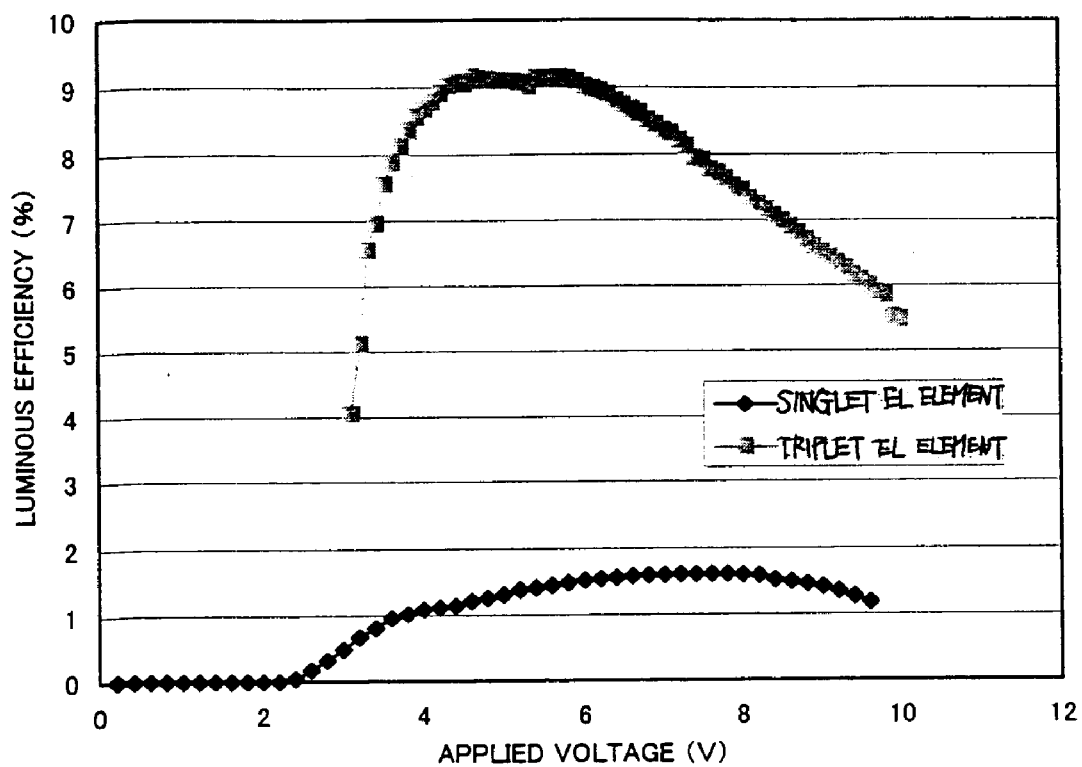
FIG. 19 is a graph showing characteristics of voltage versus luminous efficiency in a triplet EL element and a singlet EL element.

FIG. 19 shows a graph of the relationship of the applied voltage with the luminous efficiency. The triplet EL element obtains a luminous efficiency of 9% in the range of 4 to 6 V. On the contrary, the singlet EL element obtains only a luminous efficiency of 1 to 2%, in the range of 4 to 6 V and it is possible to make the triplet EL element emit brighter light.

Note that, the luminous efficiency η (ext) has a value of the below formula.

$$\eta(\text{ext}) = \frac{\pi Le}{KmhcJ} \int_{\lambda L}^{\lambda U} \frac{\frac{F(\lambda)}{\lambda} d\lambda}{\int_{\lambda L}^{\lambda U} \frac{F(\lambda)}{\lambda} y(\lambda) d\lambda} \quad [\text{Formula 3}]$$

Here, πL is total luminous flux (1 m/m²), e is a charge. Km is a maximum spectral luminous efficacy (680 m/W), J is a current density (A/m²). F (λ) is an emission spectrum of the actual measurement, and y (λ) is a standard spectral luminous efficacy curve.

Figure 20:
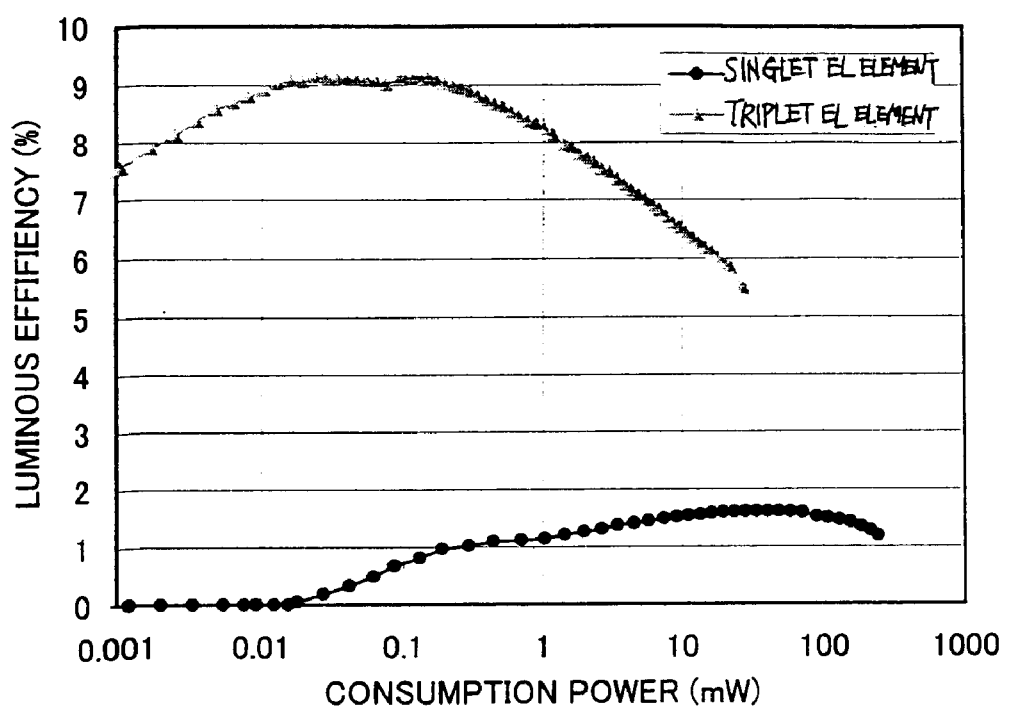
FIG. 20 is a graph showing characteristics of electric power consumption versus brightness in a triplet EL element and a singlet EL element.

FIG. 20 shows the characteristics of consumption power with luminous efficiency. Luminous efficiency does not increase with consumption power, but in the operation region with high consumption power, luminous efficiency is decreasing. However, the triplet EL element has a much higher luminous efficiency and from the viewpoint of consumption power, the triplet EL element is shown to be more superior than the singlet EL element.

Figure 21:
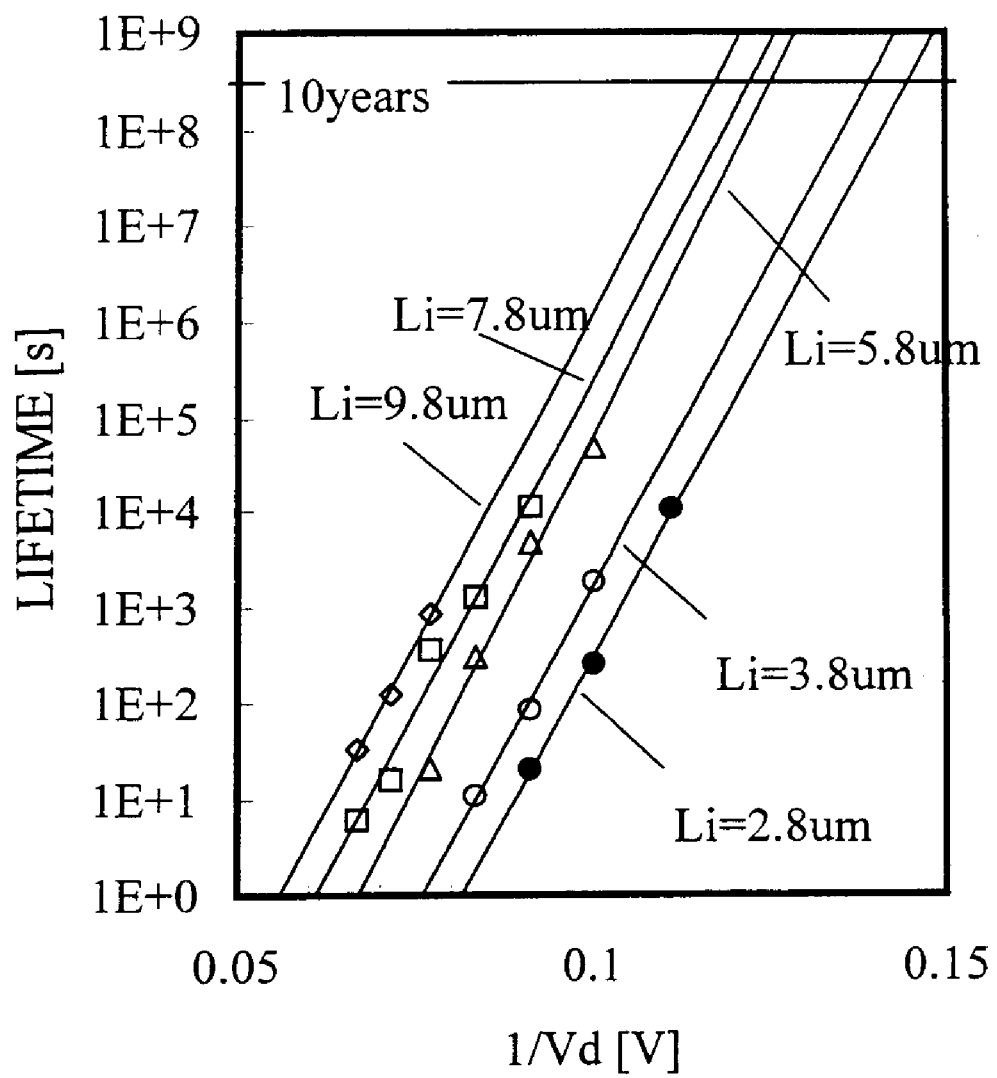
FIG. 21 is a graph showing lifetime of a TFT of the present invention.

On the other hand, FIG. 21 shows data in respect to the lifetime of the TFT (n-channel) of the single drain structure. In the graph, a constant 2V as a gate voltage and the time from when the drain voltage is steadily applied until the drain current degrades by 10% is computed and plotted thereon. The drain voltage is altered to find the time, and the straight line joins the plots, and the voltage where it crosses with 3.15×10⁸ seconds (10 years) is defined as the 10 year guarantee voltage.

Figure 22:
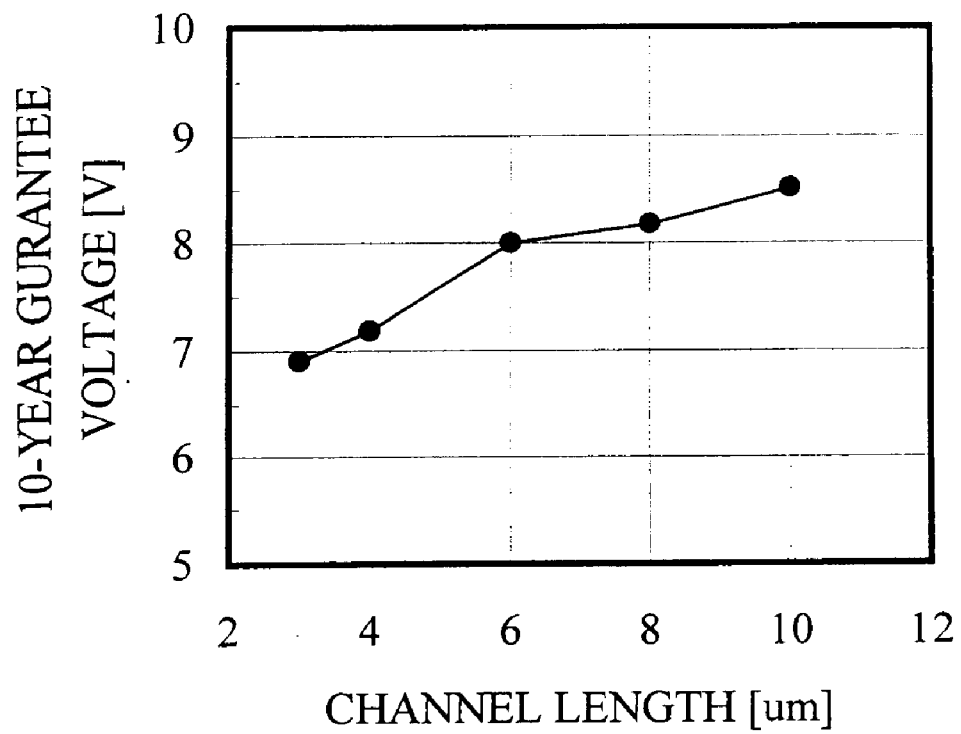
FIG. 22 is a graph showing characteristics of 10-year guarantee voltage versus channel length of a TFT of the present invention.

FIG. 22 shows the 10 year guarantee voltage when the channel length (Li) is changed to 2.8 to 9.8 μm. For example, the TFT of the single drain structure of a channel length of 3 μm. Is shown to have a 10 year guarantee voltage of about 7V. That is, it shows that there is practically no problem when it is driven with a drain voltage below such value.

With the above data, in the active matrix type light emitting device, the driver voltage of the TFT may be made lower by using the triplet EL element. As shown in FIG. 19, if the triplet EL element shown in this embodiment is used, the driver voltage may be set to the range of 4 to 6V. The TFT driven with this voltage may mostly ignore the degradation due to the hot carrier effect. Therefore, there is no need to specially provide such as an LDD and therefore it is possible to reduce the manufacturing steps and the manufacturing costs.

As shown in this invention, the driver voltage of the TFT is lowered by using the triplet EL element, and it is possible to obtain a bright display device as well as lowering the power consumption.

Embodiment 4

The light emitting display device of this invention has a superior visibility in a bright location in comparison with a liquid crystal display device since it is a self light emitting type, and also has a wide angle of view. Therefore it can be used as a display portion of various electronic equipment.

The following can be given as electronic equipment of the present invention: a video camera; a digital camera; a goggle type display (head mounted display); a navigation system; an audio device; a notebook type personal computer; a game apparatus; a wireless portable information terminal (such as a mobile computer, a cellular phone, a portable game machine, or an electronic book); and an image playback device equipped with a recording medium. Specific examples of those electronic devices are shown in FIGS. 13 and 14.

Figure 13A:
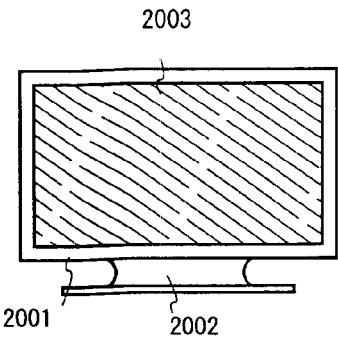
FIGS. 13A to 13F are views showing specific examples of electrical appliances.

FIG. 13A is an EL display, and includes a frame 2001, a support stand 2002, and a display portion 2003. The light emitting device of the present invention can be used in the display portion 2003. The EL display is a self-light-emitting type, and therefore a back light is not necessary, and the display portion can be made thinner than that of a liquid crystal display device.

Figure 13B:
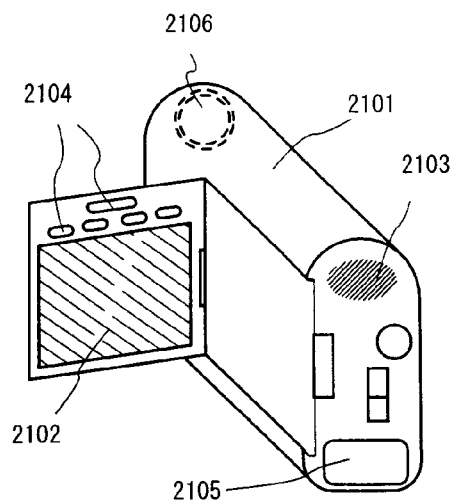

FIG. 13B is a video camera, and includes a main body 2101. a display portion 2102, a sound input portion 2103, operation switches 2104, a battery 2105, and an image receiving portion 2106. The light emitting device of the present invention can be used in the display portion 2102.

Figure 13C:
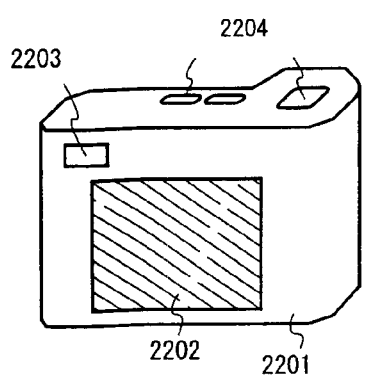

FIG. 13C is a digital camera and includes a main body 2201, a display portion 2202, an optical system 2203, an operating switch 2204. The light emitting device of the present invention can be used in the display portion 2202.

Figure 13D:
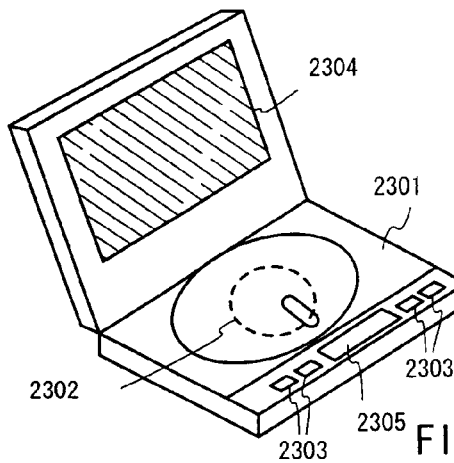

FIG. 13D is an image playback device equipped with a recording medium, and includes a main body 2301, a recording medium (such as a CD, LD or DVD) 2302, operation switches 2303, a display portion (a) 2304, and a display portion (b) 2305, etc. The display portion (a) is mainly used for displaying image information, and the display portion (b) is mainly used for displaying character information, and the light emitting device of the present invention can be used in the display portion (a) and for the display portion (b). Note that, the image playback device equipped with the recording medium includes devices such as CD playback devices and game machines.

Figure 13E:
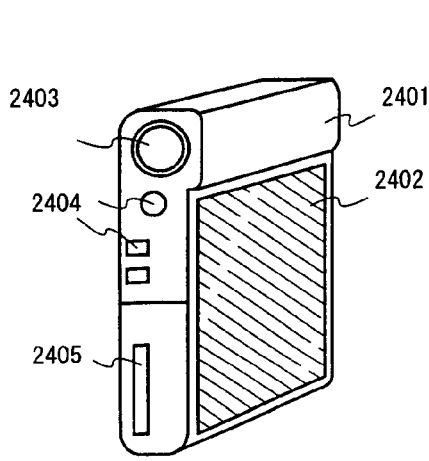

FIG. 13E is a portable (mobile) computer, and includes a main body 2401, a display portion 2402, an image receiving portion 2403, operation switches 2404, and a memory slot. The electronic optical device of the present invention can be used in the display portion 2402. This portable computer records information onto the recording medium accumulated with flash memory or volatile memory and can play back such recordings.

Figure 13F:
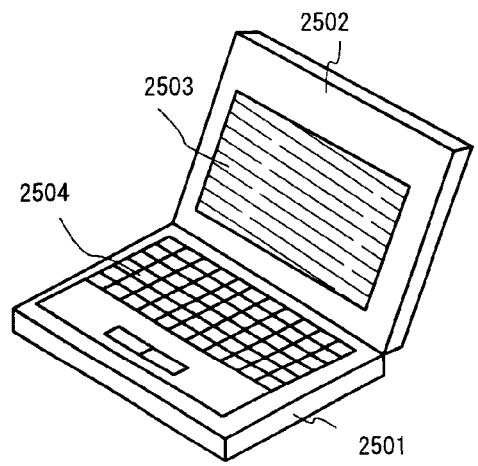

FIG. 13F is a personal computer, and includes a main body 2501, a frame 2502, a display portion 2503, and a keyboard 2504. The light emitting device of the present invention can be used in the display portion 2503.

Note that, if the brightness of light emitted by EL materials increases in the future, then it will become possible to use in a front type or a rear type projector to expand and project light containing output image information with a lens or the like.

Further, the above electronic appliances often display information distributed through an electronic communication network such as the Internet and a CATV (cable television) and radio communication such as a radio wave. In particular, there are more and more opportunities where the electronic appliances display dynamic image information. Since the response speed of an EL material is very high, an EL display device is suitable for dynamic image display.

In addition, since the light emitting device consumes power in the light emitting portion, it is therefore preferable to use the EL display device for displaying information so as to make the light emitting portions as few as possible. Consequently, when using the light emitting device in a display portion mainly for character information, such as in a portable information terminal, in particular a cellular phone or an audio playback device, it is preferable to drive so as to form character information by the light emitting portions while non-light emitting portions are set as background.

Figure 14A:
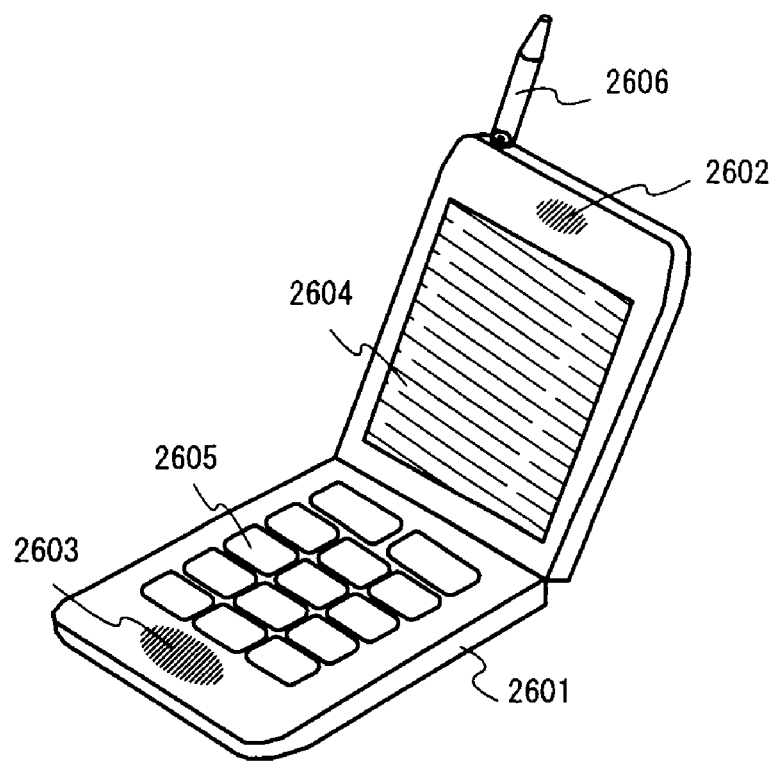
FIGS. 14A and 14B are views showing specific examples of electrical appliances.

FIG. 14A is a cellular phone, and includes a main body 2601, a sound output portion 2602, a sound input portion 2603, a display portion 2604, operation switches 2605, and an antenna 2606. The light emitting device of the present invention can be used in the display portion 2604. Note that by displaying white color characters in a black color background, the display portion 2604 can suppress the power consumption of the cellular phone.

Figure 14B:
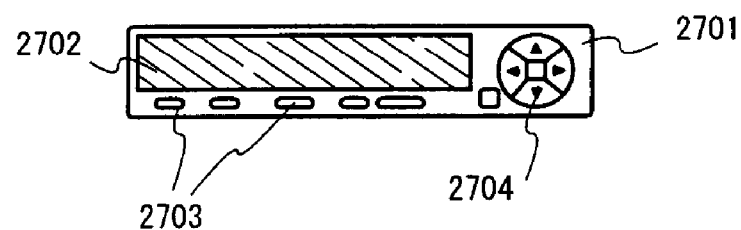

FIG. 14B is an audio playback device, (specifically a car audio system), and includes a main body 2701, a display portion 2702, and operation switches 2703 and 2704. The light emitting device of the present invention can be used in the display portion 2702. Further, a car audio system is shown in this embodiment, but the EL display device of the present invention can be used in a household audio playback system, too. Note that by displaying white color characters in a black color background, the display portion 2704 can suppress the power consumption.

Further, it is effective to incorporate the light sensor, to provide means to detect the brightness of the environment to be used, in order for it to function to modulate the luminous brightness according to the brightness of the environment to be used. If the user may maintain the brightness with a brightness of a contrast ratio of 100 to 150 compared to the brightness of the used environment, there is no problem in recognizing the image or the character information. That is, when the environment to be used is bright, the brightness of the image is increased so it is easy to see, and when the environment to be used is dark, the brightness of the image may be suppressed to thereby suppress the power consumption.

Note that, the embodiments of the present invention may be implemented with any structure of Embodiment Mode 1 to 5 and Embodiments 1 to 3.

By carrying out the present invention, an active matrix type light emitting device which is bright and has low electric power consumption and high reliability can be obtained. Further, by using that sort of light emitting device as a light source or a display portion, an electrical appliance having a bright display portion and low electric power consumption can be obtained.

What is claimed is:

1. An active matrix type light emitting device comprising:
   an electroluminescent element using a luminescent material in which electroluminescence is obtained by triplet excitation; and
   a semiconductor component electrically connected to the electroluminescent element,
   wherein the light emitting device is operated by digital driving.

2. A device according to claim 1, wherein the semiconductor component is a TFT.

3. An electrical appliance using a light emitting device according to claim 1.

4. A portable telephone using a light emitting device according to claim 1.

5. A digital camera using a light emitting device according to claim 1.

6. An audio equipment using a; light emitting device according to claim 1.

7. A wireless portable equipment using a light emitting device according to claim 1.

8. An active matrix type light emitting device comprising:
   a semiconductor component; and
   an electroluminescent element electrically connected to the semiconductor component,
   wherein the electroluminescent element includes a thin film made of a luminescent material expressed by a following formula:

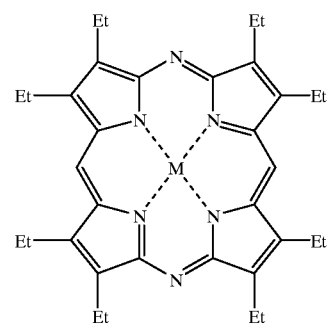

wherein Et represents etyl group; and M represents element belonging to group 8 to 10 of the periodic table, and wherein the light emitting device is operated by digital driving.

9. A device according to claim 8, wherein said M is an element selected from the group consisting of nickel, cobalt and palladium.

10. A device according to claim 8, wherein the luminescent material is a metal complex containing an element selected from the group consisting of nickel, cobalt and palladium.

11. A device according to claim 8, wherein the luminescent material is an organic compound containing an element selected from the group consisting of nickel, cobalt and palladium.

12. A device according to claim 8, wherein the semiconductor component is a TFT.

13. An electrical appliance using a light emitting device according to claim 8.

14. A portable telephone using a light emitting device according to claim 8.

15. A digital camera using a light emitting device according to claim 8.

16. An audio equipment using a light emitting device according to claim 8.

17. A wireless portable equipment using a light emitting device according to claim 8.

18. An active matrix type light emitting device comprising:
   a semiconductor component; and
   an electroluminescent element electrically connected to the semiconductor component,
   wherein the electroluminescent element includes a thin film made of a luminescent material expressed by a following formula:

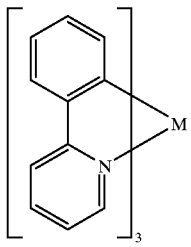

wherein M represents element belonging to group 8 to 10 of the periodic table, and wherein the light emitting device is operated by digital driving.

19. A device according to claim 18, wherein said M is an element selected from the group consisting of nickel, cobalt and palladium.

20. A device according to claim 18, wherein the luminescent material is a metal complex containing an element selected from the group consisting of nickel, cobalt and palladium.

21. A device according to claim 18, wherein the luminescent material is an organic compound containing an element selected from the group consisting of nickel, cobalt and palladium.

22. A device according to claim 18, wherein the semiconductor component is a TFT.

23. An electrical appliance using a light emitting device according to claim 18.

24. A portable telephone using a light emitting device according to claim 18.

25. A digital camera using a light emitting device according to claim 18.

26. An audio equipment using a light emitting device according to claim 18.

27. A wireless portable equipment using a light emitting device according to claim 18.

28. An active matrix type light emitting device comprising:

an electroluminescent element using a luminescent material in which electroluminescence is obtained by triplet excitation; and a thin film transistor electrically connected to the electroluminescent element, wherein a voltage applied to the electroluminescent element through the thin film transistor is 4 to 6 V, and wherein a current per area of a pixel portion of the light emitting device is 0.5 to 1 mA/cm$_2$ when the amount of light per area of the pixel region is 200 cd/m$_2$.

29. An electrical appliance using a light emitting device according to claim 28.

30. A portable telephone using a light emitting device according to claim 28.

31. A digital camera using a light emitting device according to claim 28.

32. An audio equipment using a light emitting device according to claim 28.

33. A wireless portable equipment using a light emitting device according to claim 28.

34. An active matrix type light emitting device comprising:

an electroluminescent element using a luminescent material in which electroluminescence is obtained by triplet excitation;

a thin film transistor electrically connected to the electroluminescent element;

a source signal line; and a power supply line connected to a source side of the thin film transistor, wherein when a voltage of the power supply line is 4 to 6 V, a luminous efficiency of the electroluminescent element is 9%.

35. An electrical appliance using a light emitting device according to claim 34.

36. A portable telephone using a light emitting device according to claim 34.

37. A digital camera using a light emitting device according to claim 34.

38. An audio equipment using a light emitting device according to claim 34.

39. A wireless portable equipment using a light emitting device according to claim 34.

40. An active matrix type light emitting device comprising:

an electroluminescent element using a luminescent material in which electroluminescence is obtained by triplet excitation; and a thin film transistor electrically connected to the electroluminescent element, wherein a voltage applied to the electroluminescent element through the thin film transistor is equal to or lower than 10 V, and wherein a current per area of a pixel portion of the light emitting device is 0.5 to 1 mA/cm$^2$ when the amount of light per area of the pixel region is 200 cd/m$^2$.

41. An electrical appliance using a light emitting device according to claim 40, wherein the electrical appliance is selected from the group consisting of a portable telephone, a digital camera, an audio equipment and a wireless portable equipment.

* * * * *